United States Patent
Suh et al.

(10) Patent No.: US 11,864,460 B2
(45) Date of Patent: Jan. 2, 2024

(54) ORGANIC LIGHT EMITTING DEVICE

(71) Applicant: LG CHEM, LTD., Seoul (KR)

(72) Inventors: Sang Duk Suh, Daejeon (KR); Jae Seung Ha, Daejeon (KR); Dong Hoon Lee, Daejeon (KR); Minseung Chun, Daejeon (KR); Ji Young Choi, Daejeon (KR); Woochul Lee, Daejeon (KR); Joo Ho Kim, Daejeon (KR); Hoon Jun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 523 days.

(21) Appl. No.: 17/263,514

(22) PCT Filed: Sep. 20, 2019

(86) PCT No.: PCT/KR2019/012224
§ 371 (c)(1),
(2) Date: Jan. 26, 2021

(87) PCT Pub. No.: WO2020/060280
PCT Pub. Date: Mar. 26, 2020

(65) Prior Publication Data
US 2021/0399223 A1 Dec. 23, 2021

(30) Foreign Application Priority Data
Sep. 20, 2018 (KR) .................. 10-2018-0112912

(51) Int. Cl.
*H01L 51/50* (2006.01)
*H10K 85/60* (2023.01)
(Continued)

(52) U.S. Cl.
CPC ......... *H10K 85/633* (2023.02); *H10K 85/624* (2023.02); *H10K 85/626* (2023.02);
(Continued)

(58) Field of Classification Search
CPC .. H10K 85/633; H10K 85/624; H10K 85/626; H10K 85/6574
See application file for complete search history.

(56) References Cited

U.S. PATENT DOCUMENTS

| | | | |
|---|---|---|---|
| 2009/0134781 A1 | 5/2009 | Jang et al. | |
| 2015/0179940 A1 | 6/2015 | Mujica-Fernaud et al. | |

(Continued)

FOREIGN PATENT DOCUMENTS

| | | | |
|---|---|---|---|
| JP | 2015-530364 A | 10/2015 | |
| JP | 2017-135127 A | 8/2017 | |

(Continued)

*Primary Examiner* — Anthony Ho
(74) *Attorney, Agent, or Firm* — Bryan Cave Leighton Paisner LLP

(57) ABSTRACT

An organic light emitting device including a first electrode, a second electrode provided opposite to the first electrode, and an organic material layer provided between the first electrode and the second electrode, wherein the organic material layer includes a hole transfer layer and an electron blocking layer, and the hole transfer layer and the electron blocking layer include a compound of Chemical Formula 1, the materials of the hole transfer layer and the electron blocking layer are different from each other, and one or more layers that are not the hole transfer layer and the electron blocking layer of the organic material layer include a compound of Chemical Formula 2.

10 Claims, 2 Drawing Sheets

(51) Int. Cl.
  *H10K 50/11*     (2023.01)
  *H10K 101/10*    (2023.01)
  *H10K 101/40*    (2023.01)

(52) U.S. Cl.
  CPC ......... *H10K 85/6574* (2023.02); *H10K 50/11* (2023.02); *H10K 2101/10* (2023.02); *H10K 2101/40* (2023.02)

(56) References Cited

U.S. PATENT DOCUMENTS

| | | |
|---|---|---|
| 2016/0211457 A1 | 7/2016 | Ito et al. |
| 2018/0123042 A1 | 5/2018 | Cha et al. |
| 2019/0198763 A1 | 6/2019 | Lee et al. |
| 2019/0296238 A1 | 9/2019 | Cha et al. |
| 2020/0013957 A1 | 1/2020 | Suh et al. |

FOREIGN PATENT DOCUMENTS

| | | | |
|---|---|---|---|
| KR | 2008-0071969 A | 8/2008 | |
| KR | 2016-0090444 A | 8/2016 | |
| KR | 2017-0082995 A | 7/2017 | |
| KR | 2017-0136916 A | 12/2017 | |
| KR | 2018-0022325 A | 3/2018 | |
| KR | 2018-0033100 A | 4/2018 | |
| KR | 2018-0075981 A | 7/2018 | |
| KR | 2018-0077887 A | 7/2018 | |
| KR | 2018-0098121 A | 9/2018 | |
| KR | 2018-0103737 A | 9/2018 | |
| WO | 2018-164265 A1 | 9/2018 | |

【FIG. 1】
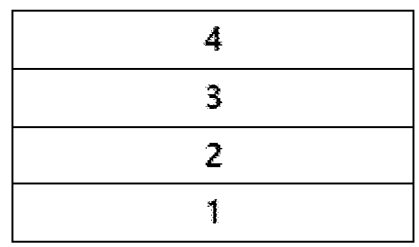
【FIG. 2】
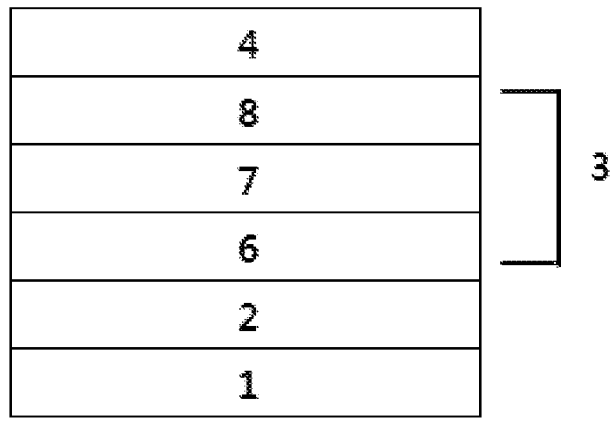

【FIG. 3】

| 4 |
|---|
| 10 |
| 9 |
| 8 |
| 7 |
| 6 |
| 5 |
| 2 |
| 1 |

ORGANIC LIGHT EMITTING DEVICE

This application is a National Stage Application of International Application No. PCT/KR2019/012224, filed Sep. 20, 2019, which claims priority to and the benefits of Korean Patent Application No. 10-2018-0112912, filed with the Korean Intellectual Property Office on Sep. 20, 2018, the entire contents of which are incorporated herein by reference.

TECHNICAL FIELD

The present specification relates to an organic light emitting device.

BACKGROUND

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, may be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

Technical Problem

The present specification is directed to providing an organic light emitting device.

Technical Solution

One embodiment of the present specification provides an organic light emitting device including a first electrode; a second electrode provided opposite to the first electrode; and an organic material layer provided between the first electrode and the second electrode, wherein the organic material layer includes a hole transfer layer and an electron blocking layer, and the hole transfer layer and the electron blocking layer include a compound of the following Chemical Formula 1;

the materials of the hole transfer layer and the electron blocking layer are different from each other; and one or more layers of the organic material layer that are neither the hole transfer layer nor the electron blocking layer include a compound of the following Chemical Formula 2:

[Chemical Formula 1]

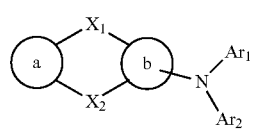

In Chemical Formula 1, $Ar_1$ and $Ar_2$ are the same as or different from each other, and each independently a substituted or unsubstituted aryl group including one or two 6-membered rings, or a substituted or unsubstituted heteroaryl group, a and b are the same as or different from each other, and each independently a substituted or unsubstituted aromatic ring, $X_1$ and $X_2$ are the same as or different from each other, and each independently a direct bond or CRR', and when one of $X_1$ and $X_2$ is a direct bond, the other one is CRR',

[Chemical Formula 2]

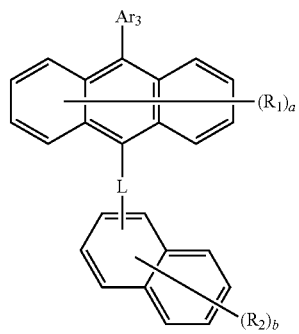

in Chemical Formula 2,

Ar3 is a substituted or unsubstituted aryl group, or a substituted or unsubstituted heteroaryl group, L is a substituted or unsubstituted arylene group, R, R', $R_1$ and $R_2$ are the same as or different from each other, and each independently hydrogen, deuterium, a substituted or unsubstituted alkyl group, or a substituted or unsubstituted aryl group, or bond to adjacent substituents to form a substituted or unsubstituted hydrocarbon ring, a is an integer of 0 to 8, b is an integer of 0 to 7, when a is a plural number, $R_1$s are the same as or different from each other, and when b is a plural number, $R_2$s are the same as or different from each other.

Advantages

An organic light emitting device according to one embodiment of the present specification has advantages of low voltage, high efficiency and long lifetime.

BRIEF DESCRIPTION OF THE DRAWINGS

FIG. 1 illustrates an organic light emitting device according to one embodiment of the present specification.

FIG. 2 illustrates an organic light emitting device according to one embodiment of the present specification.

FIG. 3 illustrates an organic light emitting device according to one embodiment of the present specification.

REFERENCE NUMERALS

1: Substrate
2: First Electrode
3: Organic Material Layer
4: Second Electrode
5: Hole Injection Layer
6: Hole Transfer Layer 7: Electron Blocking Layer
8: Light Emitting Layer
9: Electron Transfer Layer
10: Electron Injection Layer

DETAILED DESCRIPTION

Hereinafter, the present specification will be described in more detail.

When using a compound of Chemical Formula 1 of the present disclosure in a hole transfer layer and an electron blocking layer, properties advantageous for hole injection and migration may be obtained since interfacial properties between the hole transfer layer and the electron blocking layer become superior due to similar structures. Generally, a higher HOMO energy level is required for a hole transfer layer that is in contact with a hole injection layer compared to an electron blocking layer, and high triplet state energy is required for the electron blocking layer. When varying a position of substitution of an amine group in a structure of Chemical Formula 1, HOMO energy level, triplet state energy and the like may be controlled to be different, and proper properties required for each layer may be satisfied. Accordingly, when two layers include the same material, properties required for each layer may not be satisfied, and when only any one layer uses a compound of Chemical Formula 1, a voltage may increase due to decreased interfacial properties, whereas, when compounds of Chemical Formula 1 that are different from each other are each used in a hole transfer layer and an electron blocking layer, such issues may all be overcome, and properties of low voltage and high efficiency may be obtained when used in an organic electroluminescent device. Compared to when using a compound of Chemical Formula 1 of the present disclosure in each of a hole transfer layer, an electron blocking layer and a light emitting layer, properties advantageous for hole injection and migration may be obtained when using the compound of Chemical Formula 1 of the present disclosure in a hole transfer layer and an electron blocking layer due to similar structures of the compounds used in both of the layers.

Particularly, when using the compound in each of the layers while varying the position of substitution of the amine group, the properties may be controlled to properties proper for the role of each of the layers.

In addition, when using a structure of Chemical Formula 2 as a host material, the angle between anthracene and L of Chemical Formula 2, and L and naphthyl is vertical, and the conjugation length may be controlled to be short and the distance between the anthracene accumulated by the lengthened molecule may be kept close, which is advantageous for charge transfer.

In the fused aryl group, triplet energy decreases as the number of fused rings increases. Since the structure of Chemical Formula 2 used as a light emitting layer host includes an anthracene structure, triplet energy may be smaller than the light emitting layer host when the structure of Chemical Formula 1 includes a functional group including three or more 6-membered rings such as anthracene.

Even when maintaining the structure of Chemical Formula 1 of the present disclosure, a material used as the electron blocking layer needs to have greater triplet energy than the host material of the light emitting layer in order to function as a blocking layer.

In the present application, a description of a certain part "including" certain constituents means capable of further including other constituents, and does not exclude other constituents unless particularly stated on the contrary.

In the present application, a description of a certain member being placed "on" another member includes not only a case of the one member in contact with the another member but a case of still another member being present between the two members.

Examples of substituents in the present specification are described below, however, the substituents are not limited thereto.

The term "substitution" means a hydrogen atom bonding to a carbon atom of a compound is changed to another substituent. The position of substitution is not limited as long as it is a position at which the hydrogen atom is substituted, that is, a position at which a substituent can substitute, and when two or more substituents substitute, the two or more substituents may be the same as or different from each other.

In the present specification, the term "substituted or unsubstituted" means being substituted with one, two or more substituents selected from the group consisting of deuterium; a nitrile group; a substituted or unsubstituted alkyl group; a substituted or unsubstituted cycloalkyl group; a substituted or unsubstituted silyl group; a substituted or unsubstituted aryl group; and a substituted or unsubstituted heterocyclic group, or being substituted with a substituent linking two or more substituents among the substituents illustrated above, or having no substituents. For example, "a substituent linking two or more substituents" may include an aryl group substituted with an aryl group, an aryl group substituted with a heteroaryl group, a heterocyclic group substituted with an aryl group, an aryl group substituted with an alkyl group, and the like.

In the present specification, the alkyl group may be linear or branched, and although not particularly limited thereto, the number of carbon atoms is preferably from 1 to 30. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 30 carbon atoms, and more preferably has 3 to 20 carbon atoms. Specific examples thereof may include a cyclopropyl group; a cyclobutyl group; a cyclopentyl group; a 3-methylcyclopentyl group; a 2,3-dimethylcyclopentyl group; a cyclohexyl group; a 3-methylcyclohexyl group; a 4-methylcyclohexyl group; a 2,3-dimethylcyclohexyl group; a 3,4,5-trimethylcyclohexyl group; a 4-tert-butylcyclohexyl group; a cycloheptyl group; a cyclooctyl group and the like, but are not limited thereto.

In the present specification, the aryl group is not particularly limited, but preferably has 6 to 30 carbon atoms, and the aryl group may be monocyclic or polycyclic.

When the aryl group is a monocyclic aryl group, the number of carbon atoms is not particularly limited, but is preferably from 6 to 30. Specific examples of the monocyclic aryl group may include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group may include a naphthyl group, an anthracenyl group, a phenanthryl group, triphenylene group, a pyrenyl group, a phenalenyl group, a perylenyl group, a chrysenyl group, a fluorenyl group and the like, but are not limited thereto.

In the present specification, the fluorenyl group may be substituted, and adjacent groups may bond to each other to form a ring.

When the fluorenyl group is substituted,

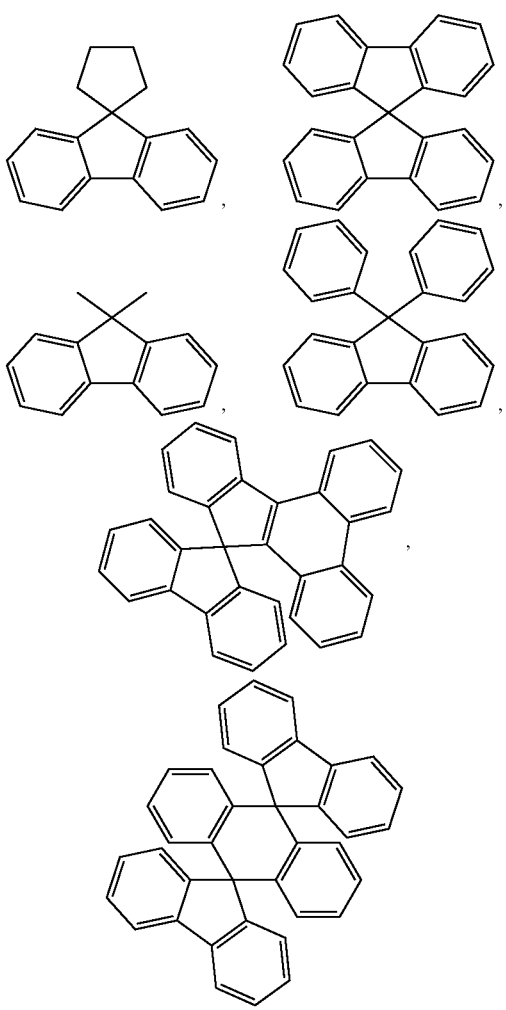

and the like may be included. However, the structure is not limited thereto.

In the present specification, the heteroaryl group is a group including one or more atoms that are not carbon, that is, heteroatoms, and specifically, the heteroatom may include one or more atoms selected from the group consisting of O, N, Se, S and the like. The number of carbon atoms of the heteroaryl group is not particularly limited, but is preferably from 2 to 30, and the heteroaryl group may be monocyclic or polycyclic. Examples of the heteroaryl group may include a thiophene group, a furanyl group, a pyrrole group, an imidazolyl group, a triazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidinyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group, an isoxazolyl group, a thiadiazolyl group, a phenothiazinyl group, a dibenzofuranyl group and the like, but are not limited thereto.

In the present specification, the arylene group has the same definition as the aryl group except for being divalent.

In the present specification, the heteroarylene group has the same definition as the heteroaryl group except for being divalent.

In the present specification, the hydrocarbon ring has the same definition as the aryl group or the cycloalkyl group except for being not monovalent.

In the present specification, Chemical Formula 1 is the following Chemical Formula 1-1.

[Chemical Formula 1-1]

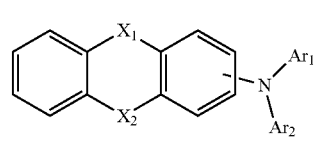

In Chemical Formula 1-1, $Ar_1$, $Ar_2$, $X_1$ and $X_2$ have the same definitions as in Chemical Formula 1.

In the present specification, the electron blocking layer includes a compound of the following Chemical Formula 1-2 or Chemical Formula 1-3.

[Chemical Formula 1-2]

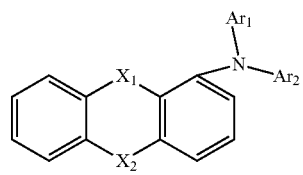

[Chemical Formula 1-3]

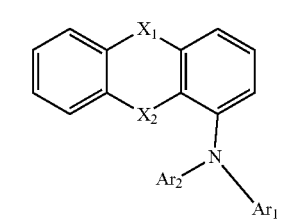

In Chemical Formula 1-2 and Chemical Formula 1-3, $Ar_1$, $Ar_2$, $X_1$ and $X_2$ have the same definitions as in Chemical Formula 1.

In the present specification, the hole transfer layer includes a compound of the following Chemical Formula 1-4 or Chemical Formula 1-5.

[Chemical Formula 1-4]

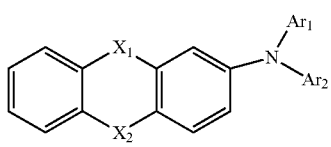

[Chemical Formula 1-5]

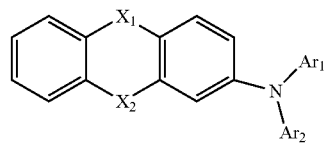

In Chemical Formula 1-4 and Chemical Formula 1-5, $Ar_1$, $Ar_2$, $X_1$ and $X_2$ have the same definitions as in Chemical Formula 1.

In the present specification, the organic material layer including the compound of Chemical Formula 2 is a light emitting layer.

In the present specification, Chemical Formula 2 is the following Chemical Formula 2-1 or 2-2.

[Chemical Formula 2-1]

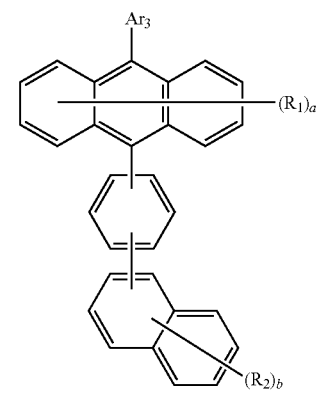

[Chemical Formula 2-2]

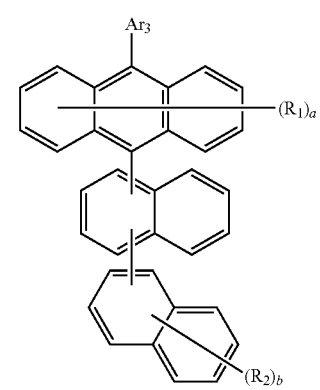

In Chemical Formulae 2-1 and 2-2, $Ar_1$, $R_1$ and $R_2$ have the same definitions as in Chemical Formula 2.

In the present specification, Chemical Formula 2 is the following Chemical Formula 2-3 or 2-4.

[Chemical Formula 2-3]

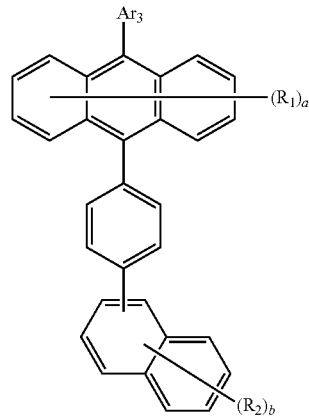

[Chemical Formula 2-4]

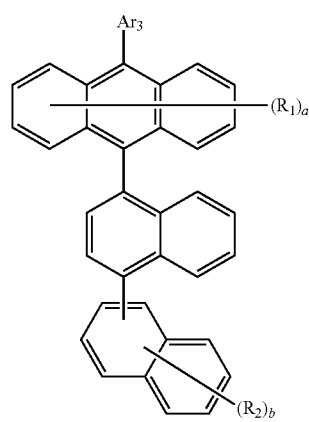

In Chemical Formulae 2-3 and 2-4, $Ar_3$, $R_1$ and $R_2$ have the same definitions as in Chemical Formula 2.

In the present specification, the organic material layer further includes a light emitting layer, and triplet energy of the electron blocking layer is larger than triplet energy of a host of the light emitting layer.

In the present specification, $Ar_1$ and $Ar_2$ are the same as or different from each other, and each independently a substituted or unsubstituted aryl group having 6 to 30 carbon atoms, or a substituted or unsubstituted heteroaryl group having 2 to 30 carbon atoms.

In the present specification, $Ar_1$ and $Ar_2$ are each a substituted or unsubstituted aryl group having 6 to 30 carbon atoms.

In the present specification, $Ar_1$ and $Ar_2$ are each a substituted or unsubstituted heteroaryl group having 2 to 30 carbon atoms.

In the present specification, $Ar_1$ and $Ar_2$ are the same as or different from each other, and each independently an aryl group having 6 to 30 carbon atoms unsubstituted or substituted with an alkyl group, or a substituted or unsubstituted heteroaryl group having 2 to 30 carbon atoms.

In the present specification, $Ar_1$ and $Ar_2$ are the same as or different from each other, and each independently an aryl group having 6 to 30 carbon atoms unsubstituted or substituted with an alkyl group having 1 to 10 carbon atoms, or a substituted or unsubstituted heteroaryl group having 2 to 30 carbon atoms.

In the present specification, $Ar_1$ and $Ar_2$ are the same as or different from each other, and each independently an aryl group having 6 to 30 carbon atoms unsubstituted or substituted with a methyl group, an ethyl group, a propyl group, an isopropyl group, a butyl group, a tert-butyl group, a pentyl group or a hexyl group.

In the present specification, $Ar_1$ and $Ar_2$ are the same as or different from each other, and each independently an aryl group having 6 to 30 carbon atoms unsubstituted or substituted with a methyl group, an ethyl group, a propyl group, an isopropyl group, a butyl group, a tert-butyl group, a pentyl group or a hexyl group.

In the present specification, $Ar_1$ and $Ar_2$ are the same as or different from each other, and each independently a phenyl group, a biphenyl group, a terphenyl group, a naphthyl group, a fluorene group, an anthracene group, a phenanthrene group or a triphenylene group, and the phenyl group, the biphenyl group, the terphenyl group, the naphthyl group, the fluorene group, the anthracene group, the phenanthrene group or the triphenylene group is unsubstituted or substituted with a methyl group, an ethyl group, a propyl group, an isopropyl group, a butyl group, a tert-butyl group, a pentyl group or a hexyl group.

In the present specification, $Ar_1$ and $Ar_2$ are the same as or different from each other, and each independently a phenyl group, a biphenyl group or a fluorene group, and the phenyl group, the biphenyl group or the fluorene group is unsubstituted or substituted with a methyl group, an ethyl group, a propyl group, an isopropyl group, a butyl group, a tert-butyl group, a pentyl group or a hexyl group.

In the present specification, $Ar_1$ and $Ar_2$ are each independently a phenyl group unsubstituted or substituted with one or more substituents selected from the group consisting of a methyl group, an ethyl group, a propyl group, an isopropyl group, a butyl group, a tert-butyl group, a pentyl group and a hexyl group.

In the present specification, $Ar_1$ and $Ar_2$ are each independently a biphenyl group unsubstituted or substituted with one or more substituents selected from the group consisting of a methyl group, an ethyl group, a propyl group, an isopropyl group, a butyl group, a tert-butyl group, a pentyl group and a hexyl group.

In the present specification, $Ar_1$ and $Ar_2$ are each independently a fluorene group unsubstituted or substituted with one or more substituents selected from the group consisting of a methyl group, an ethyl group, a propyl group, an isopropyl group, a butyl group, a tert-butyl group, a pentyl group and a hexyl group.

In the present specification, $Ar_1$ and $Ar_2$ are the same as or different from each other, and each independently a biphenyl group, or a fluorene group substituted with a methyl group.

In the present specification, a and b are the same as or different from each other, and each independently a substituted or unsubstituted aromatic ring having 6 to 10 carbon atoms.

In the present specification, a and b are a substituted or unsubstituted aromatic ring having 6 to 10 carbon atoms.

In the present specification, a and b are an aromatic ring having 6 to 10 carbon atoms.

In the present specification, a and b are a benzene ring.

In the present specification, $X_1$ and $X_2$ are the same as or different from each other, and each independently a direct bond or CRR', and when one of $X_1$ and $X_2$ is a direct bond, the other one is CRR'.

In the present specification, $X_1$ is CRR', and $X_2$ is a direct bond.

In the present specification, $X_1$ is CRR', and $X_2$ is CRR'.

In the present specification, $X_2$ is CRR', and $X_1$ is a direct bond.

In the present specification, $Ar_3$ is a substituted or unsubstituted aryl group having 6 to 30 carbon atoms, or a substituted or unsubstituted heteroaryl group having 3 to 30 carbon atoms.

In the present specification, $Ar_3$ is an aryl group having 6 to 30 carbon atoms.

In the present specification, $Ar_3$ is a phenyl group, a biphenyl group, a terphenyl group, a naphthyl group, an anthracene group, a phenanthrene group, a dibenzothiophene group or a dibenzofuran group.

In the present specification, $Ar_3$ is a phenyl group, a naphthyl group or a dibenzofuran group.

In the present specification, $Ar_3$ is a phenyl group.

In the present specification, $Ar_3$ is a naphthyl group.

In the present specification, $Ar_3$ is a dibenzofuran group.

In the present specification, L is a substituted or unsubstituted arylene group having 6 to 30 carbon atoms.

In the present specification, L is an arylene group having 6 to 30 carbon atoms.

In the present specification, L is a phenylene group, a biphenylene group, a terphenylene group, a naphthylene group, a divalent anthracene group, a divalent phenanthrene group, a divalent fluorene group or a divalent triphenylene group.

In the present specification, L is a phenylene group, a naphthylene group or a divalent anthracene group.

In the present specification, L is a phenylene group.

In the present specification, L is a naphthylene group.

In the present specification, L is a divalent anthracene group.

In the present specification, R, R', $R_1$ and $R_2$ are the same as or different from each other, and each independently hydrogen, deuterium, a substituted or unsubstituted alkyl group, or a substituted or unsubstituted aryl group, or bond to adjacent substituents to form a substituted or unsubstituted hydrocarbon ring.

In the present specification, R, R', $R_1$ and $R_2$ are the same as or different from each other, and each independently hydrogen, deuterium, or a substituted or unsubstituted aryl group, or bond to adjacent substituents to form a substituted or unsubstituted hydrocarbon ring.

In the present specification, R, R', $R_1$ and $R_2$ are the same as or different from each other, and each independently hydrogen, deuterium, or a substituted or unsubstituted aryl group.

In the present specification, R, R', $R_1$ and $R_2$ are hydrogen, deuterium, or bond to adjacent substituents to form a substituted or unsubstituted hydrocarbon ring.

In the present specification, R, R', $R_1$ and $R_2$ are the same as or different from each other, and each independently hydrogen, deuterium, or an aryl group unsubstituted or substituted with an alkyl group, or bond to adjacent substituents to form a substituted or unsubstituted hydrocarbon ring.

In the present specification, R, R', $R_1$ and $R_2$ are the same as or different from each other, and each independently hydrogen, deuterium, or an aryl group having 6 to 30 carbon atoms unsubstituted or substituted with an alkyl group having 1 to 10 carbon atoms, or bond to adjacent substituents to form a hydrocarbon ring unsubstituted or substituted with an alkyl group having 1 to 10 carbon atoms.

In the present specification, R, R', $R_1$ and $R_2$ are the same as or different from each other, and each independently hydrogen, deuterium, or an aryl group having 6 to 30 carbon atoms unsubstituted or substituted with a methyl group, an ethyl group, a propyl group, an isopropyl group, a butyl group or a tert-butyl group, or bond to adjacent substituents to form a hydrocarbon ring unsubstituted or substituted with a methyl group, an ethyl group, a propyl group, an isopropyl group, a butyl group or a tert-butyl group.

In the present specification, R, R', $R_1$ and $R_2$ are the same as or different from each other, and each independently hydrogen, deuterium, a phenyl group or a biphenyl group, and the phenyl group or the biphenyl group may be unsubstituted or substituted with a methyl group, an ethyl group, a propyl group, an isopropyl group, a butyl group or a tert-butyl group.

In the present specification, the compound of Chemical Formula 1 may be selected from among the following specific examples.

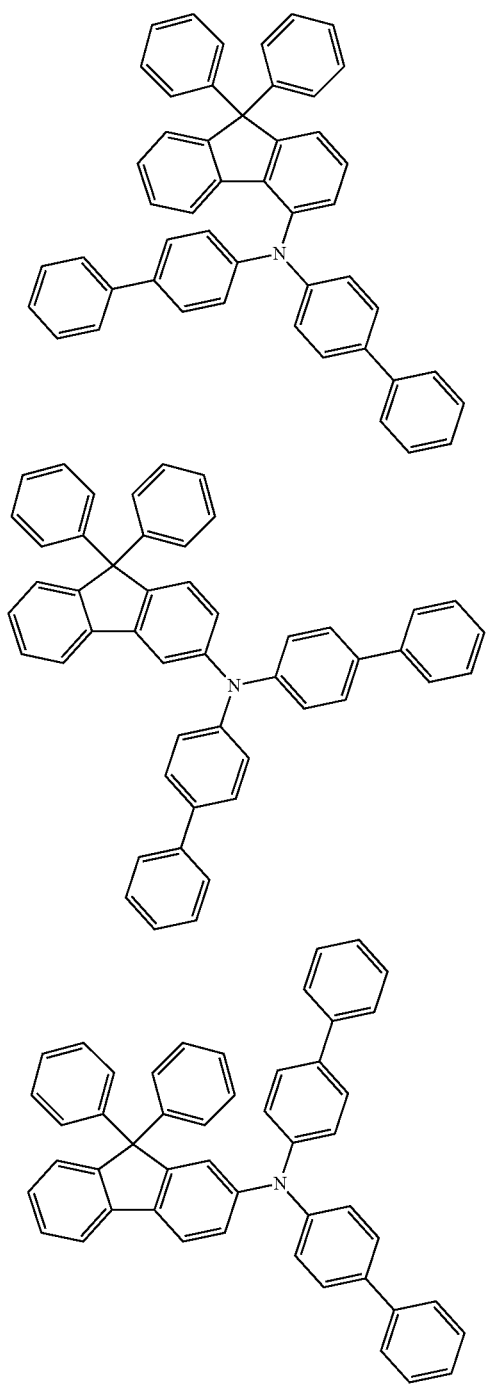

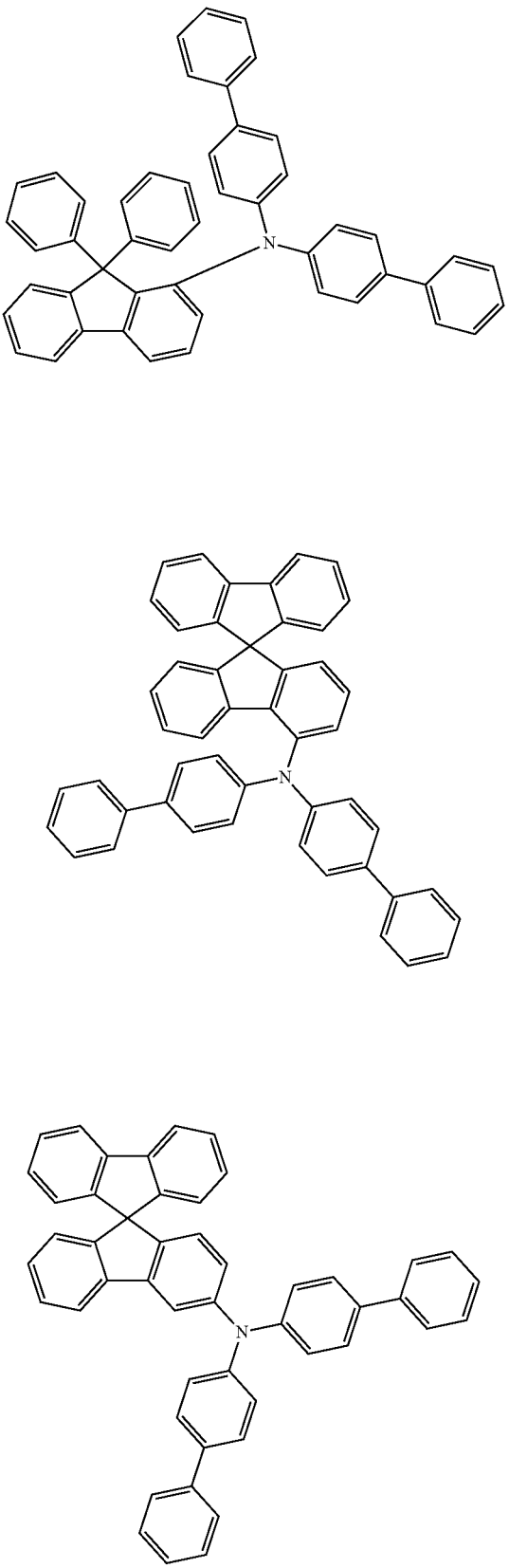

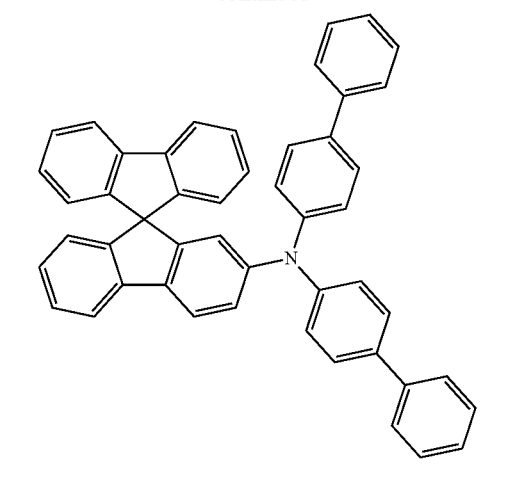
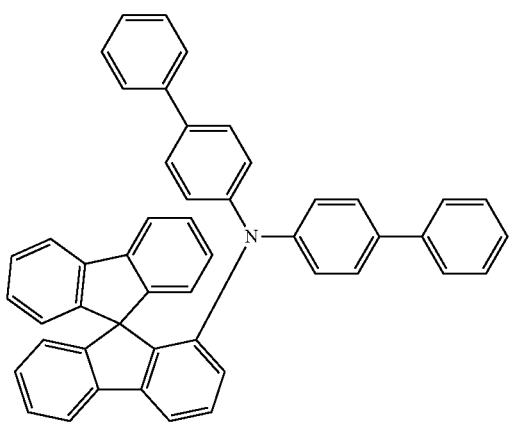
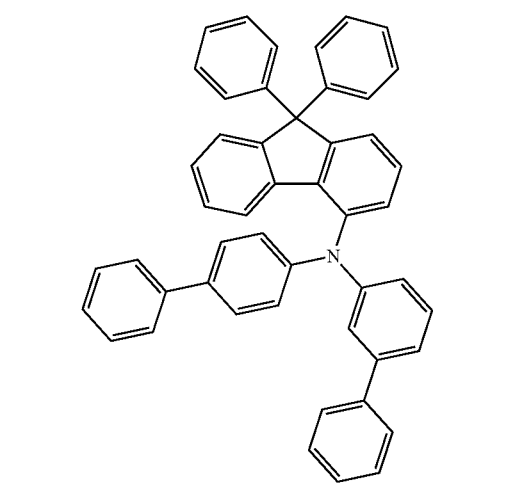
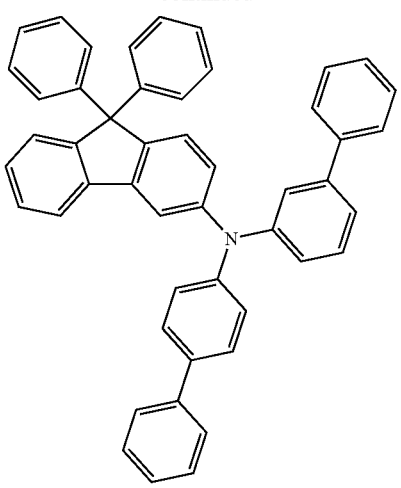
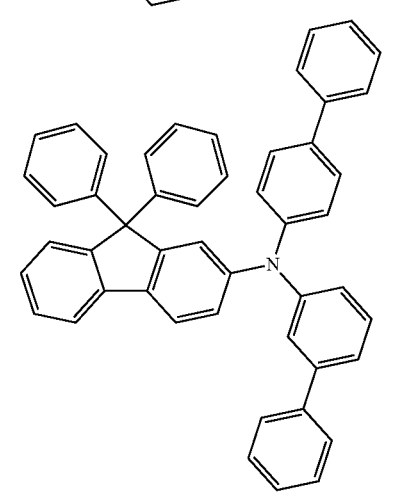
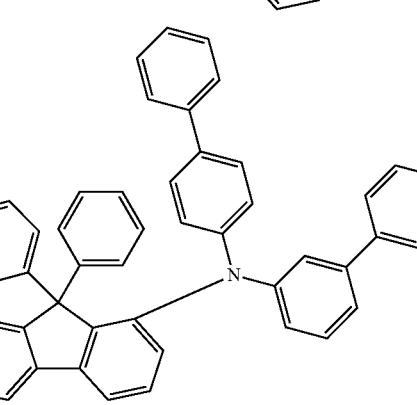
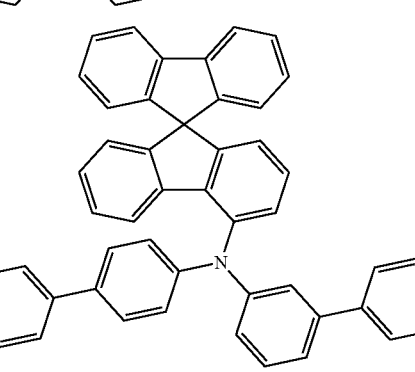

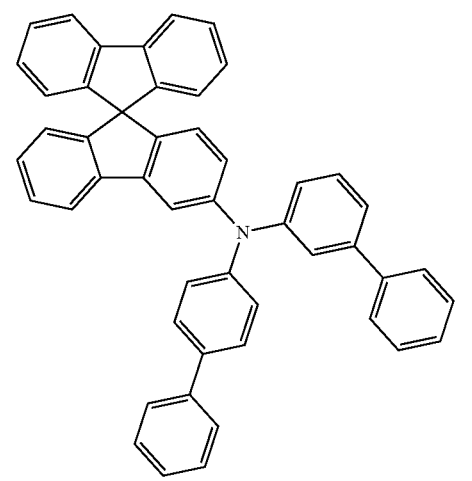
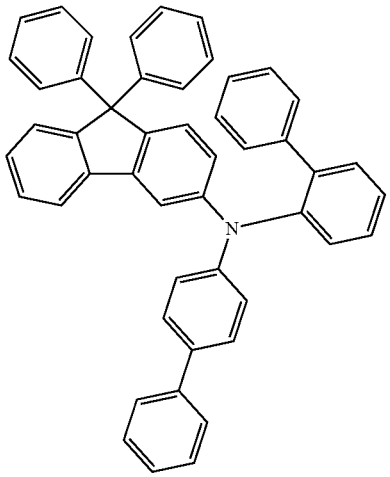
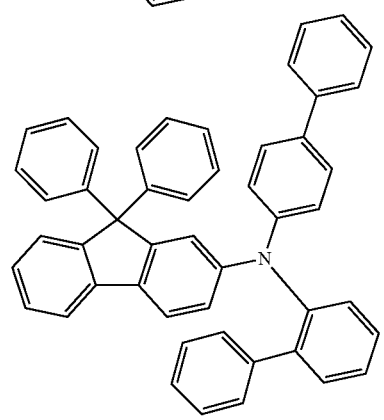
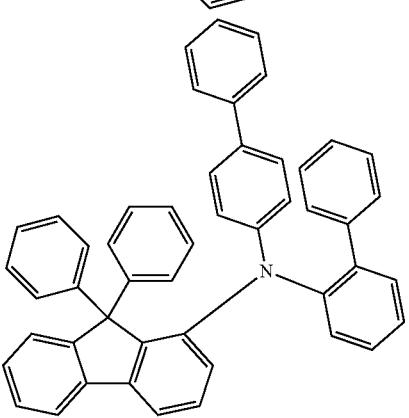
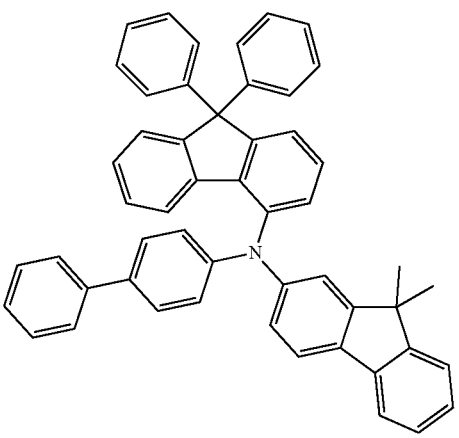

17
-continued
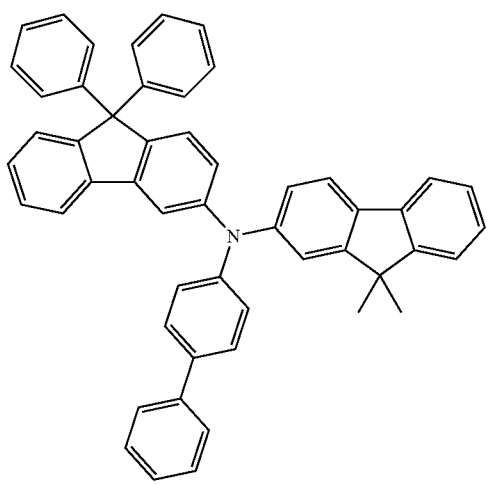
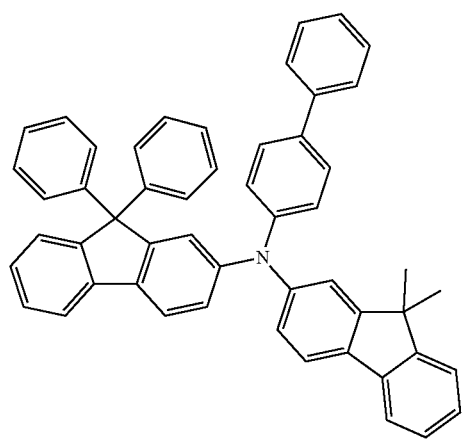
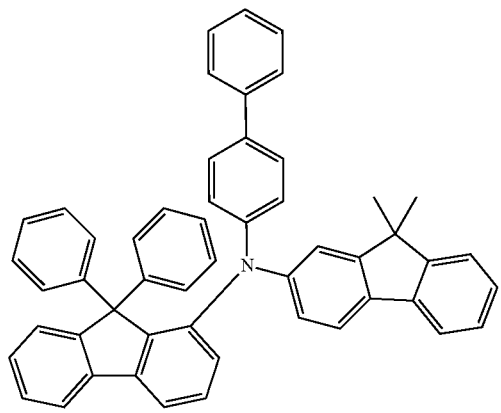
18
-continued
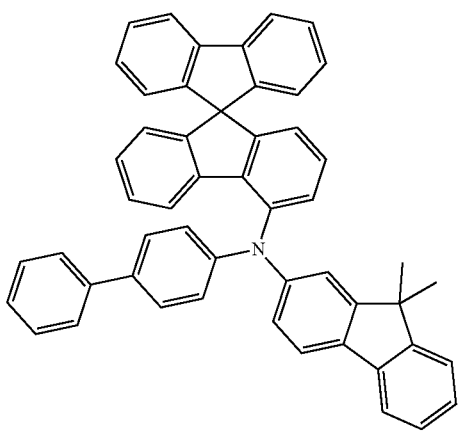
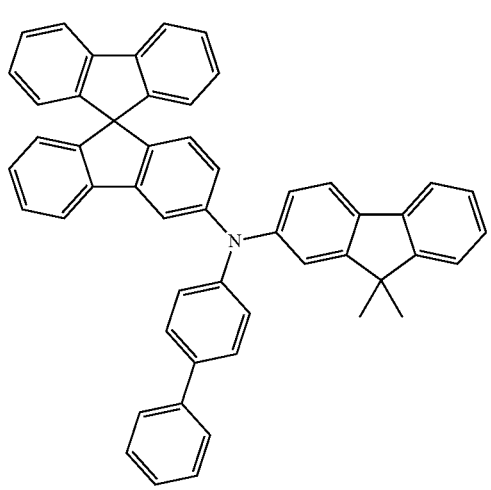
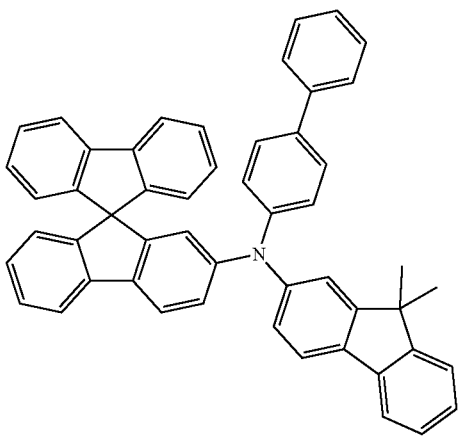

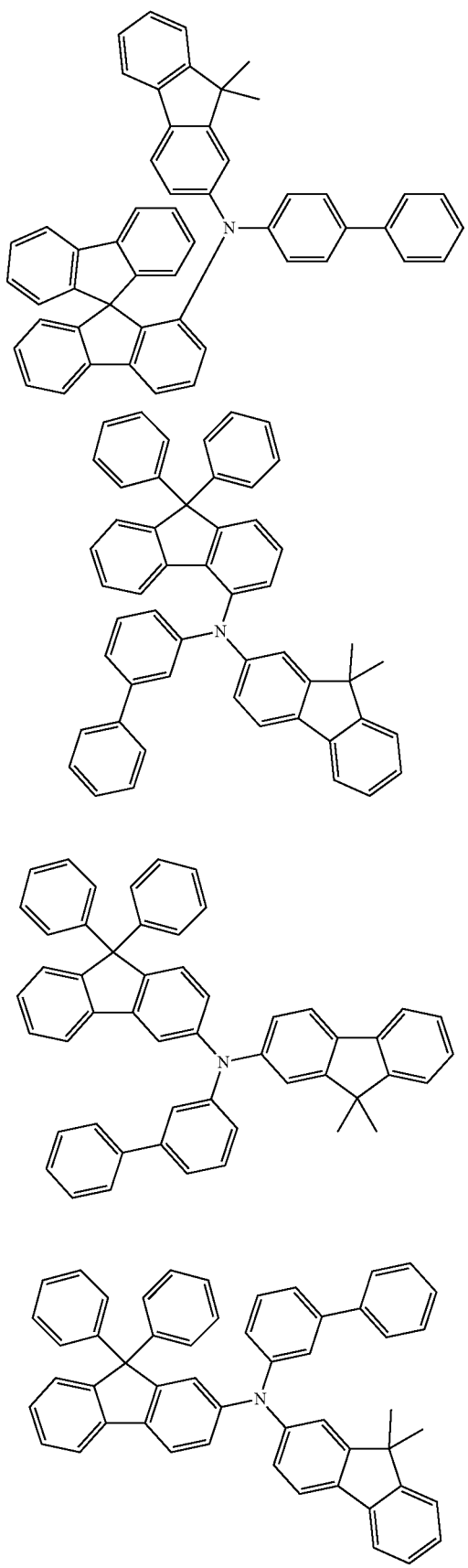
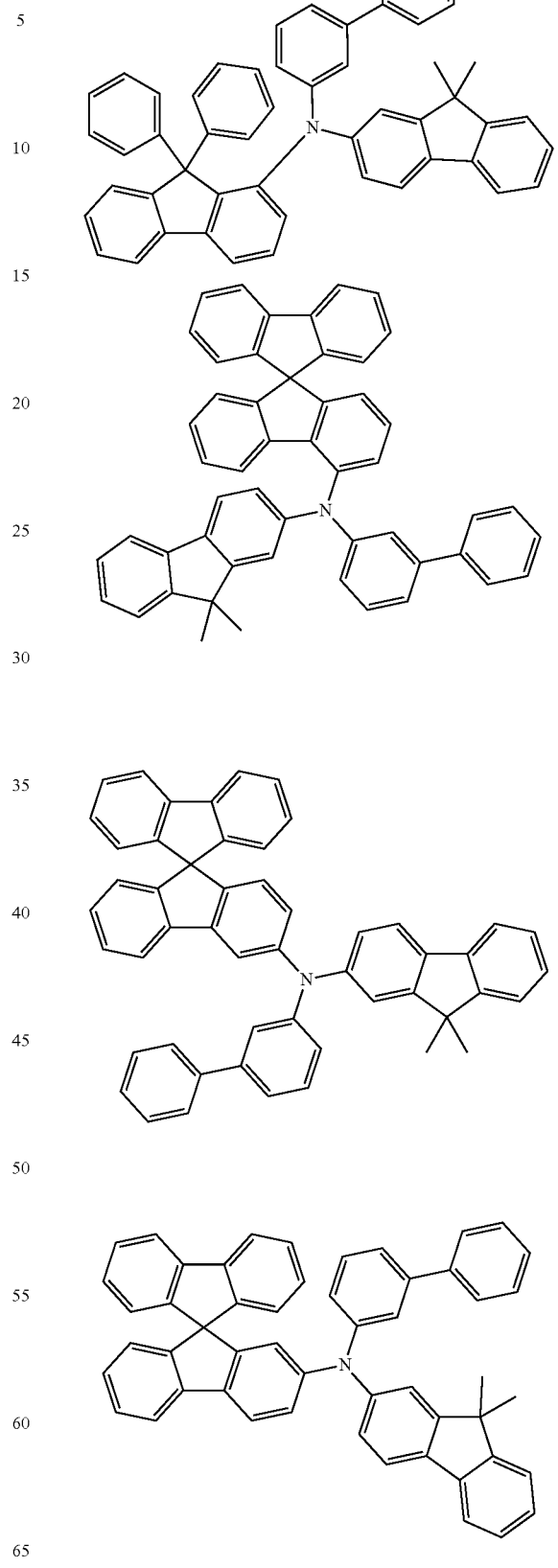

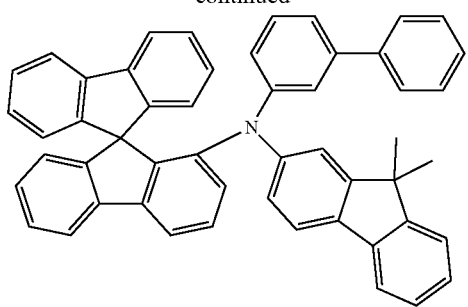
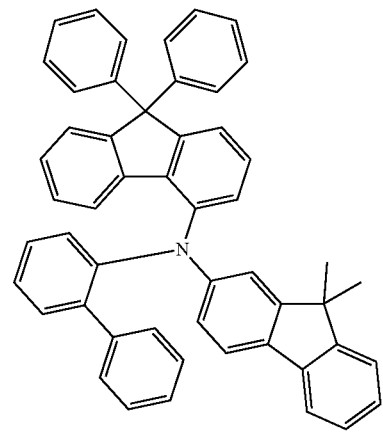
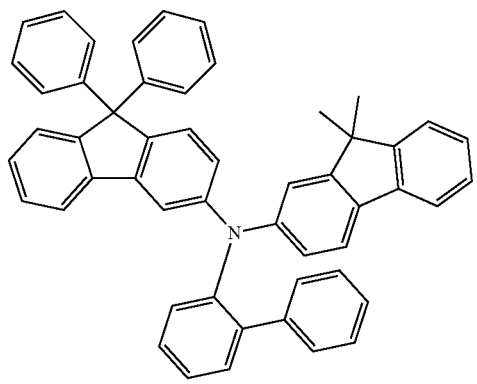
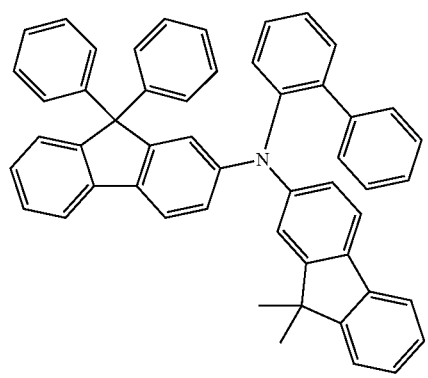
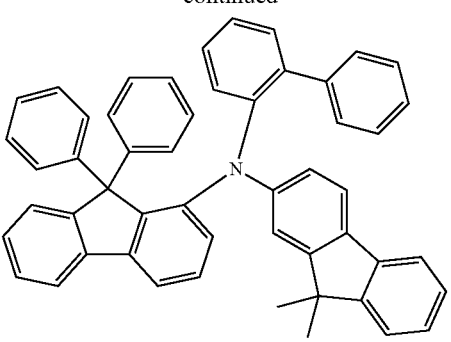
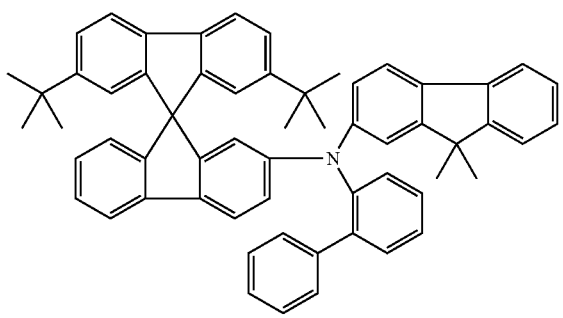
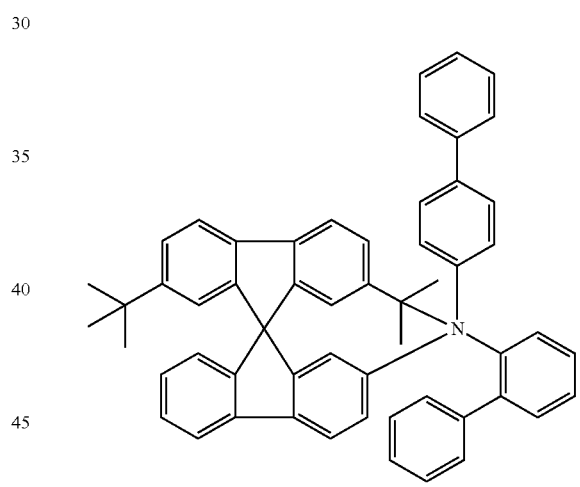
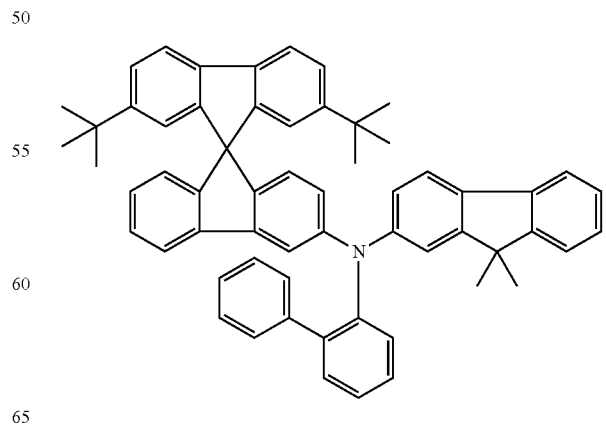

-continued
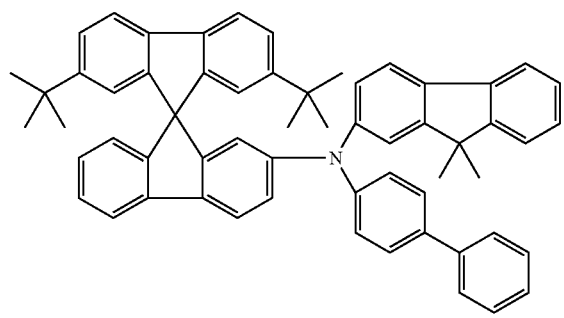
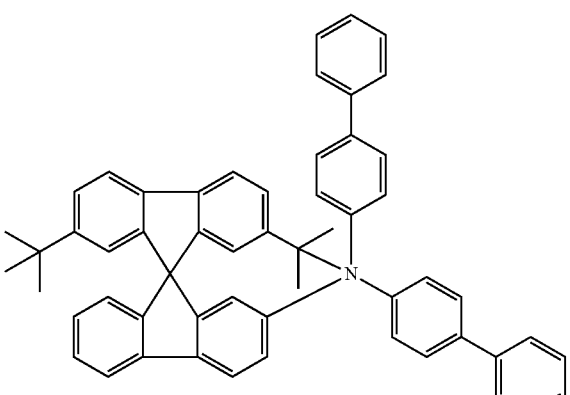
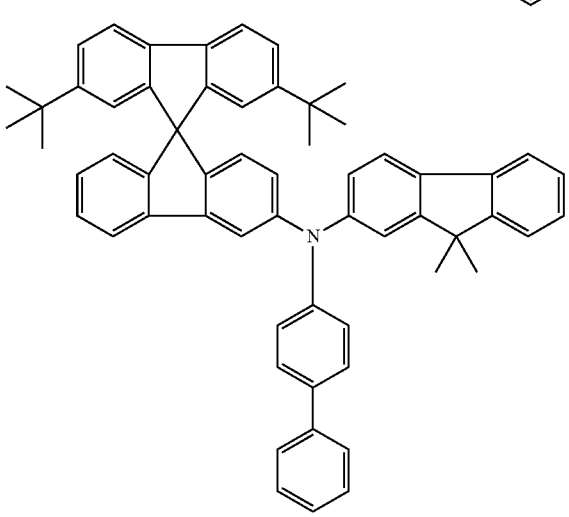
-continued
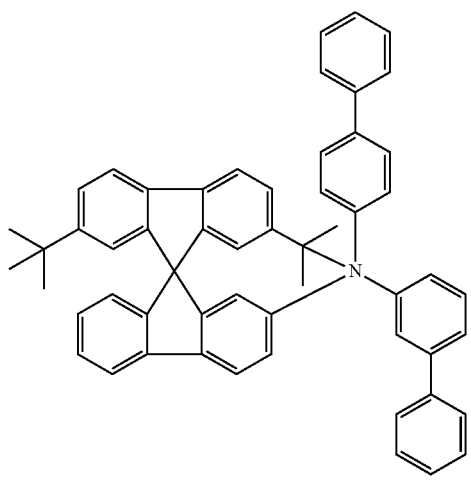
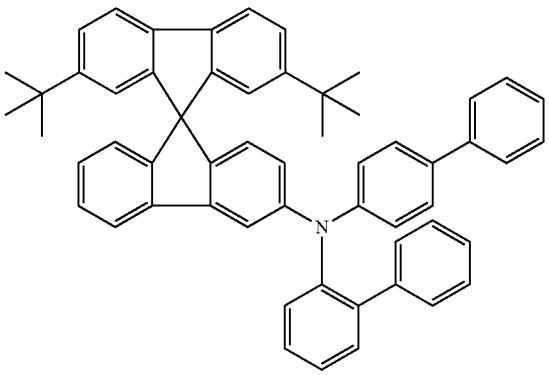

25
-continued
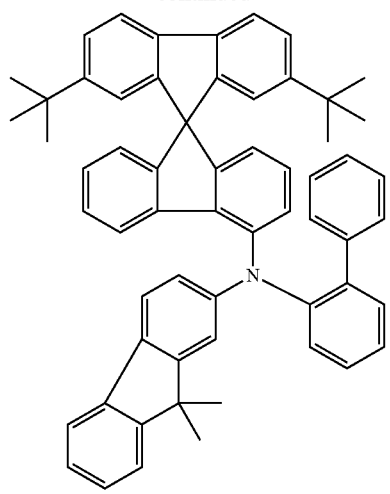
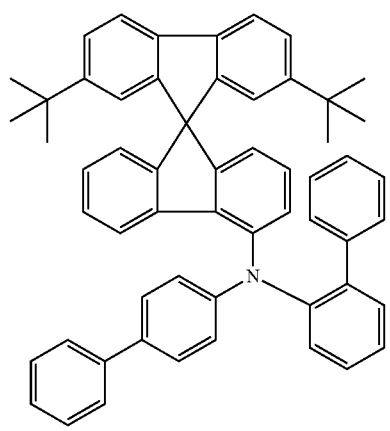
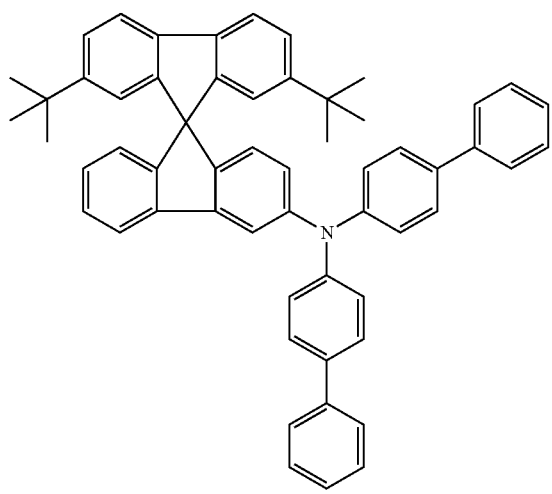
26
-continued
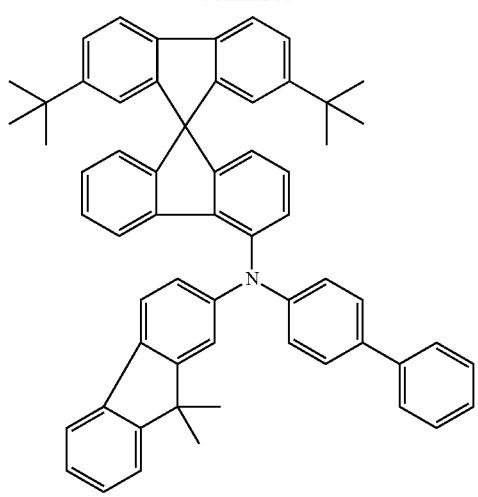
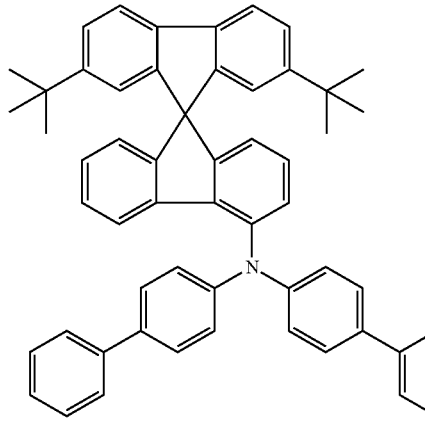
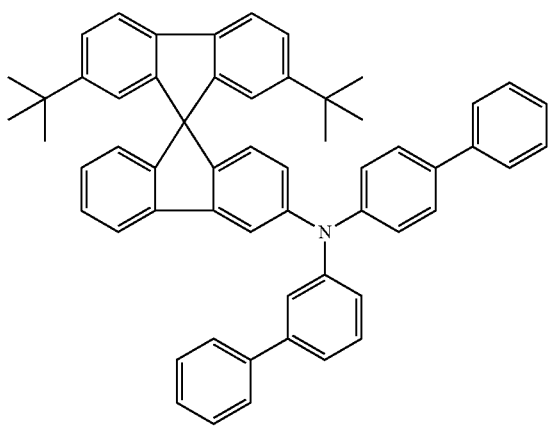

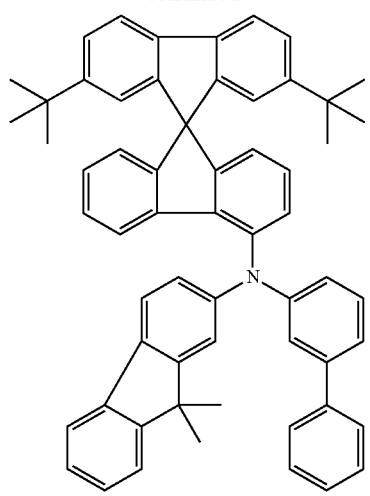
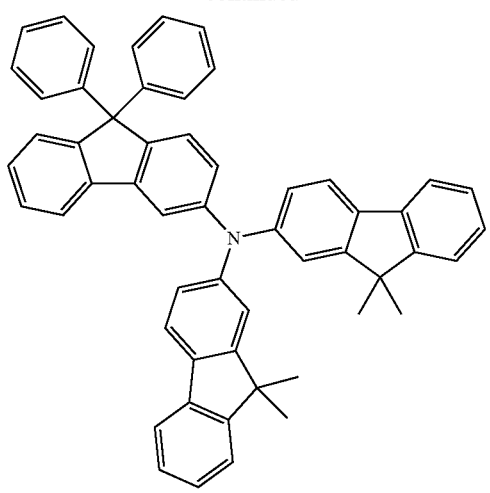
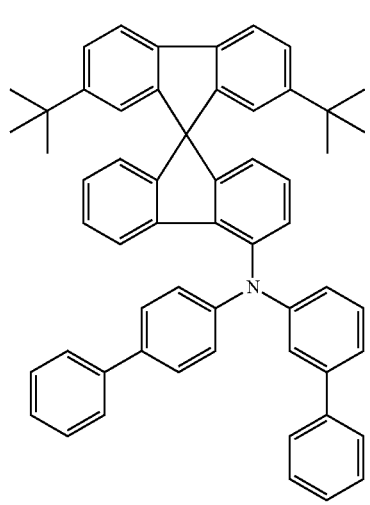
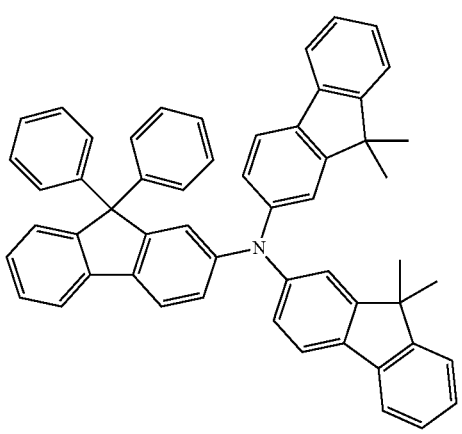
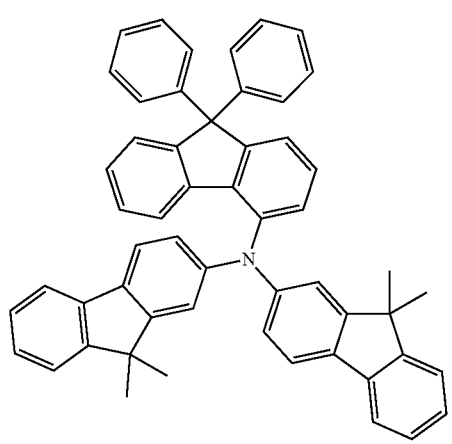
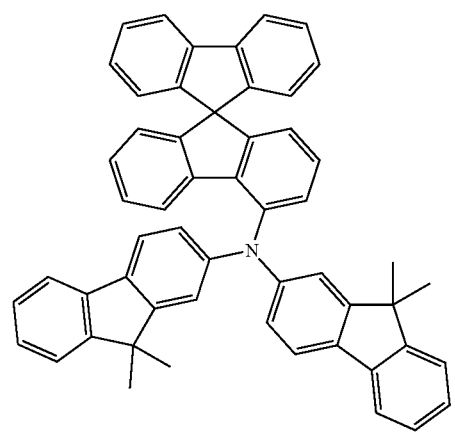

29
-continued
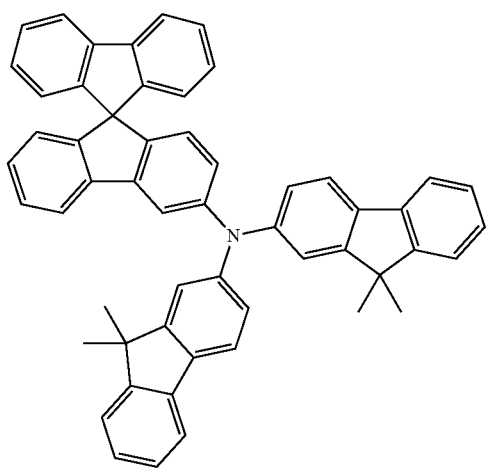
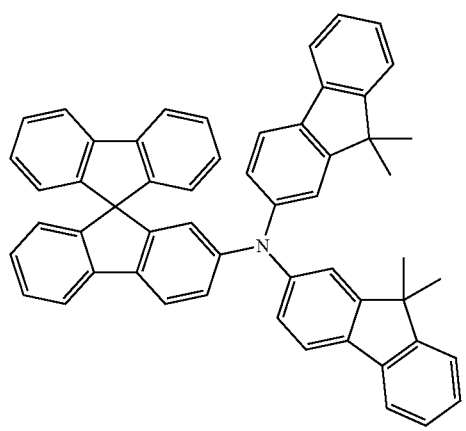
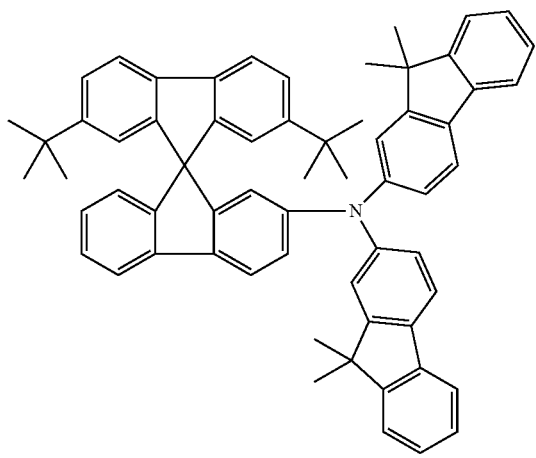
30
-continued
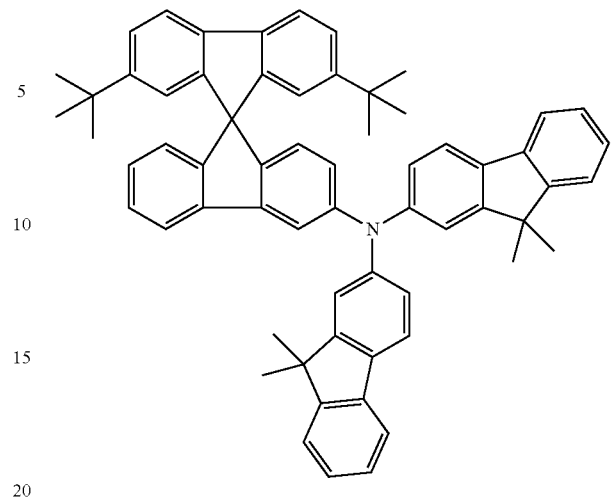
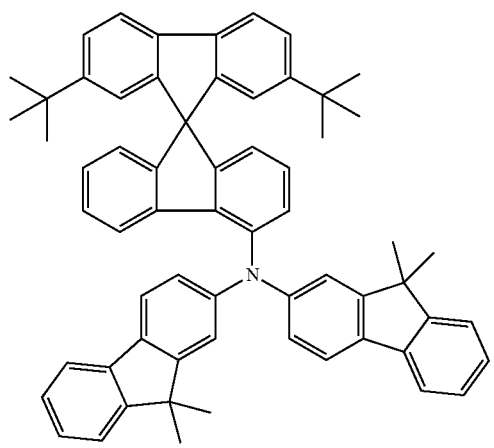
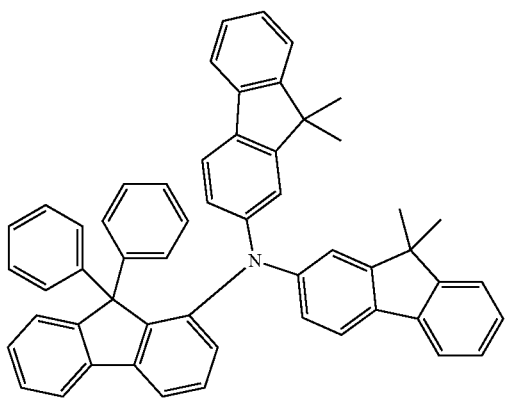

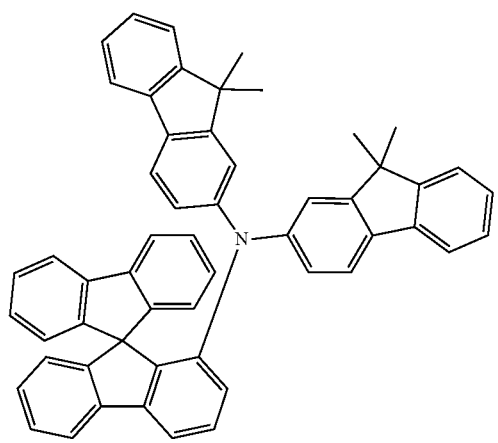
In one embodiment of the present disclosure, the compound of Chemical Formula 2 is any one of the following structural formulae.
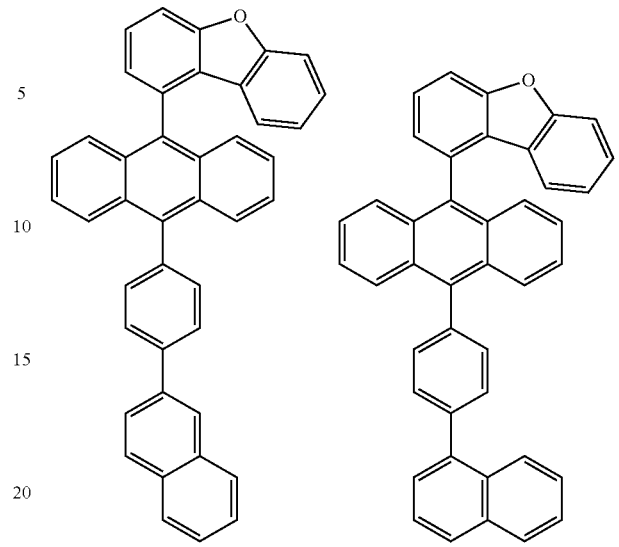
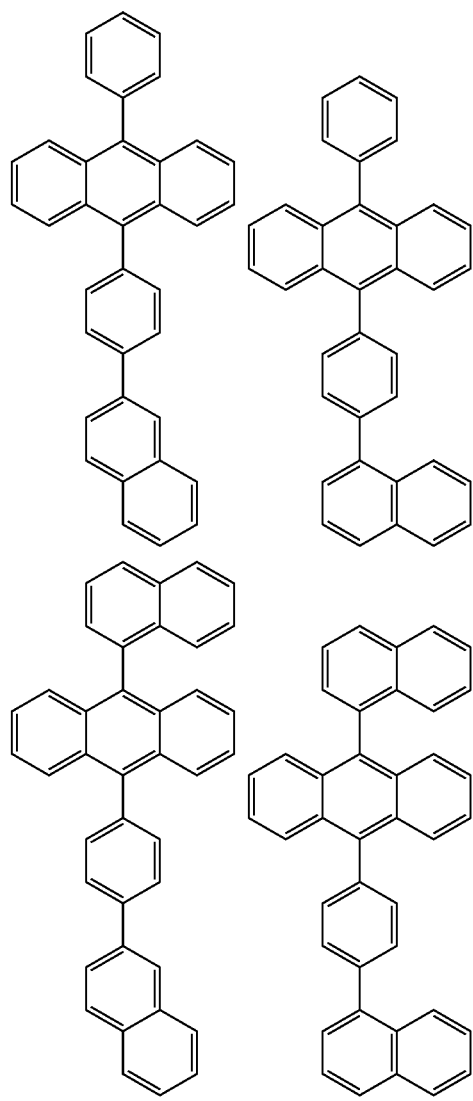
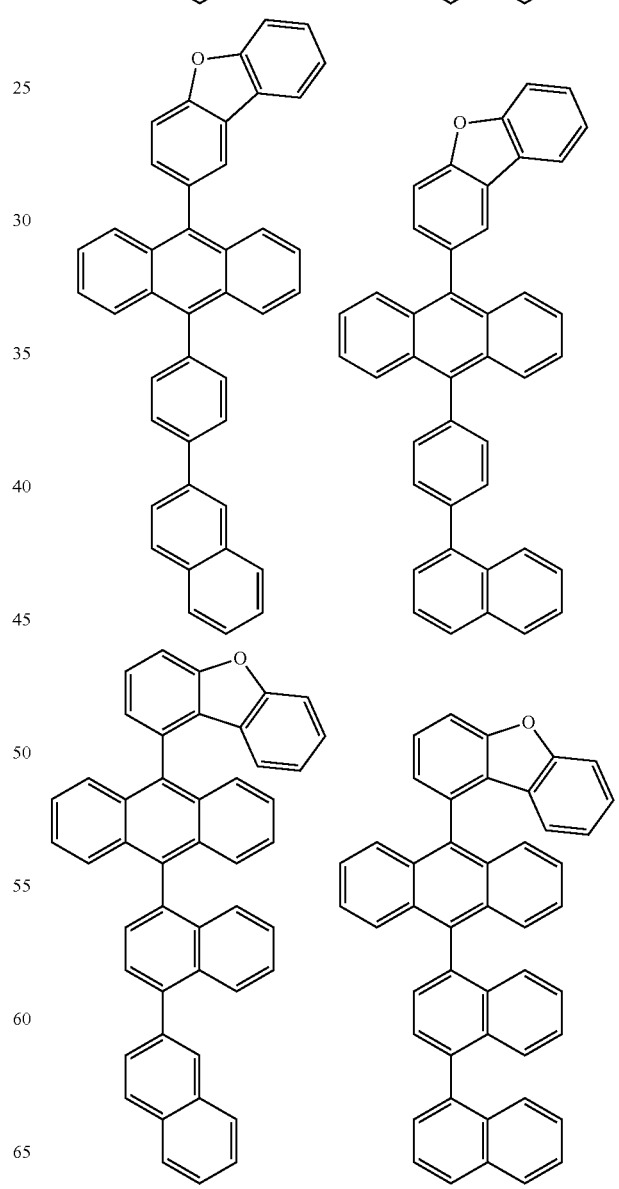

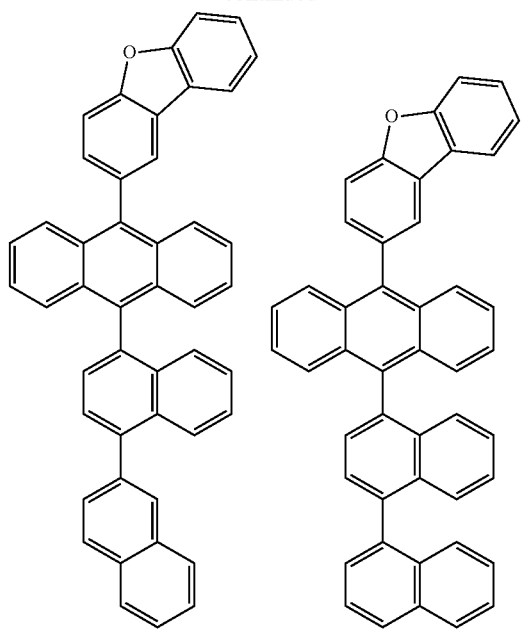
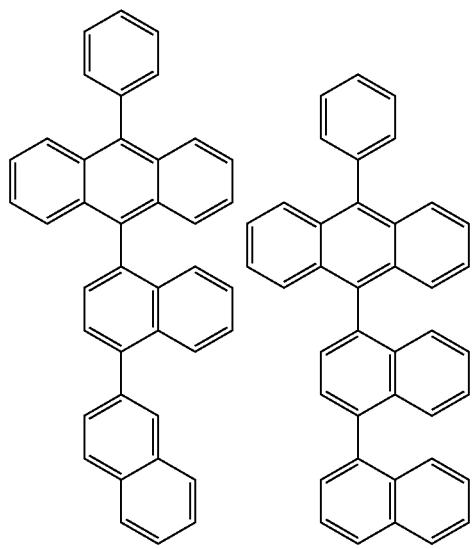
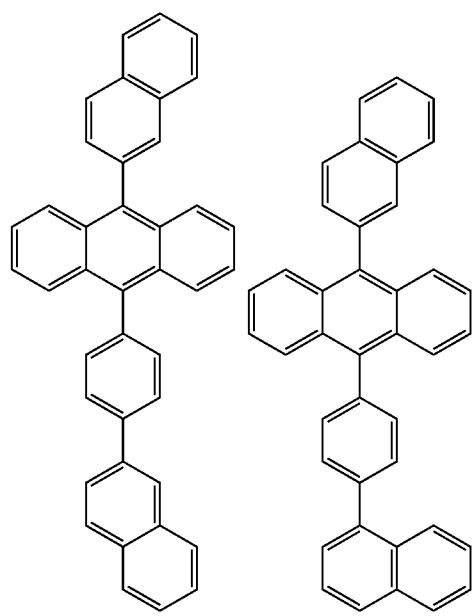
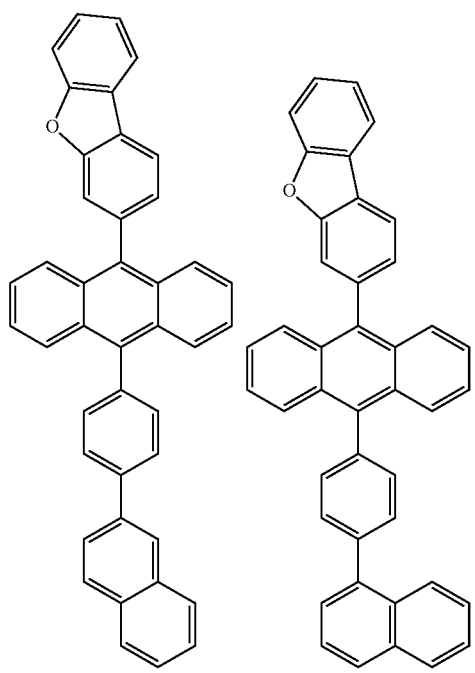

35
-continued
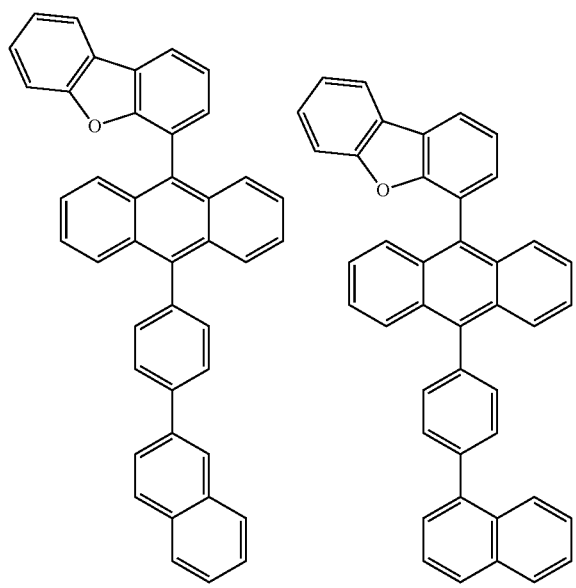
36
-continued
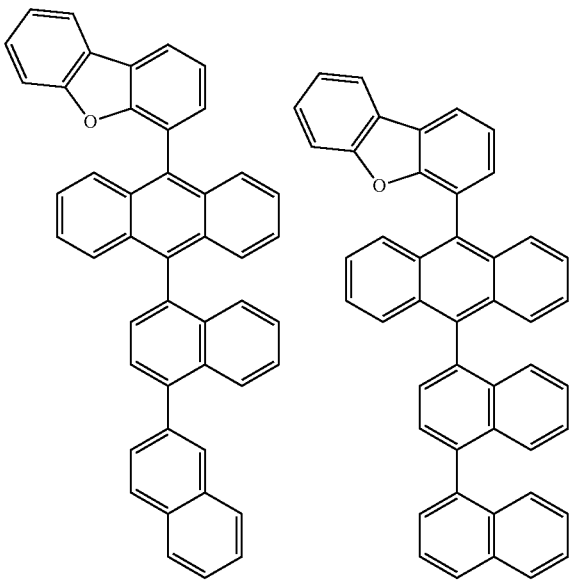
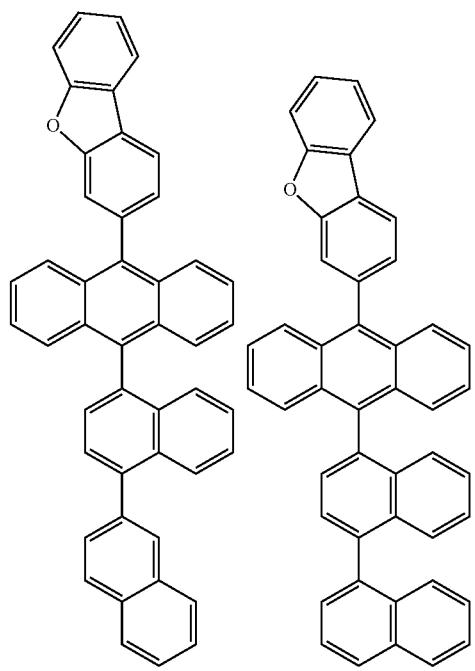
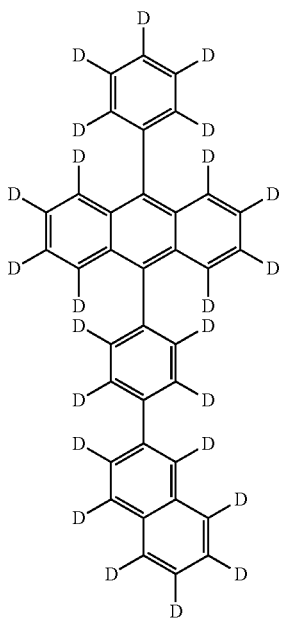

-continued
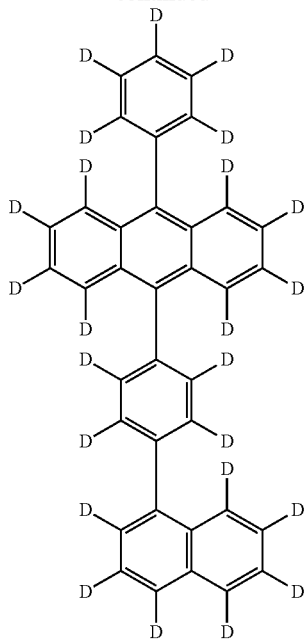
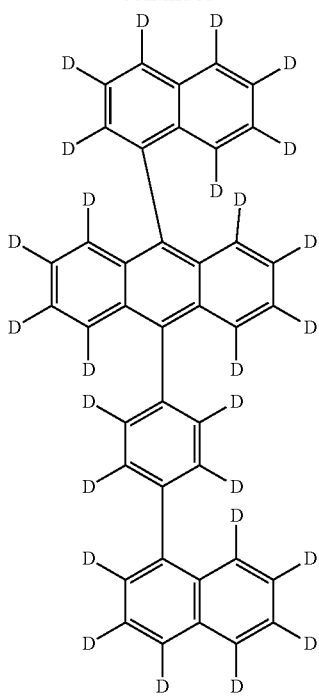
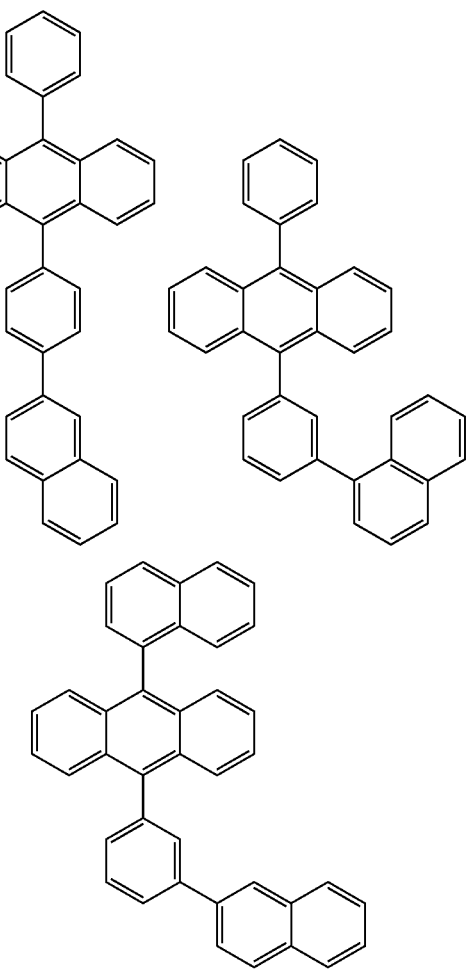
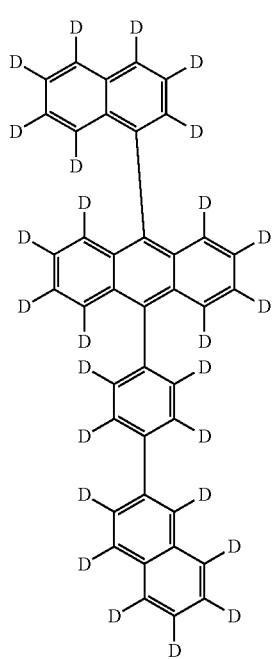

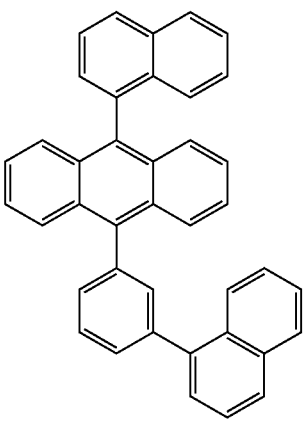
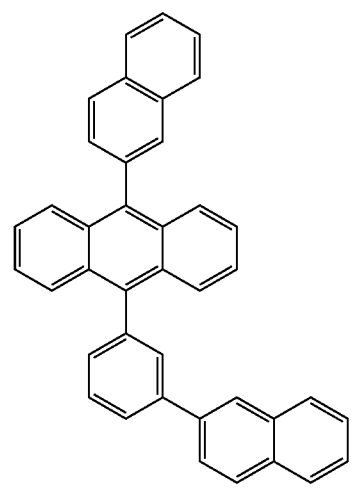
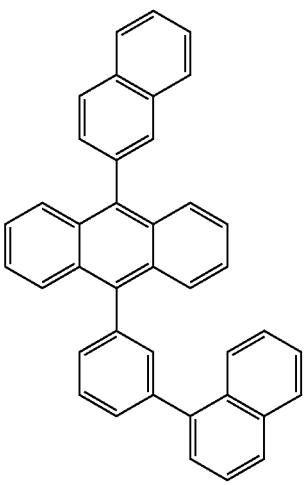
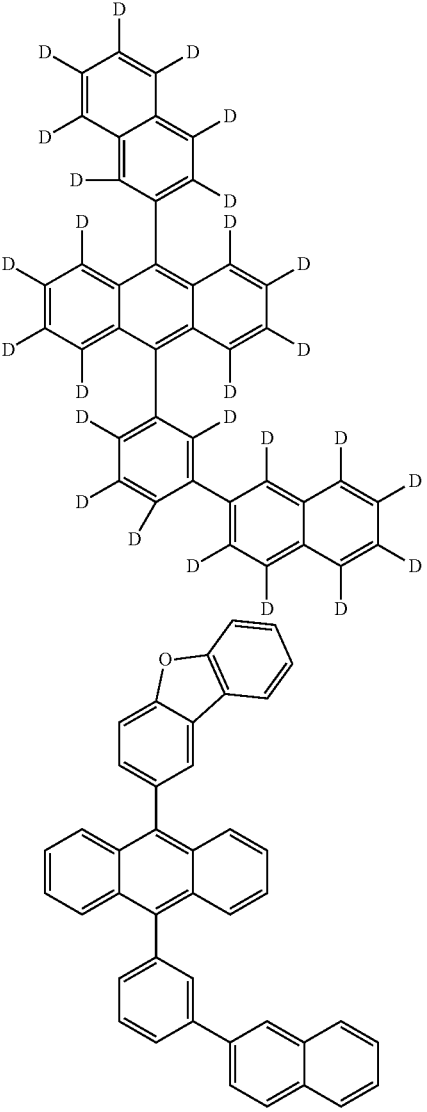
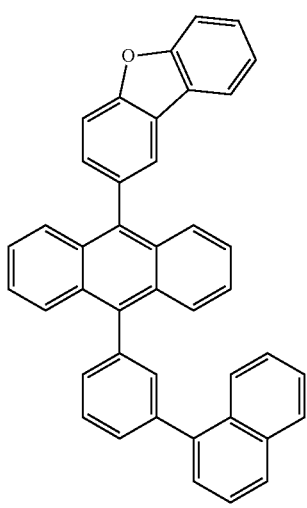

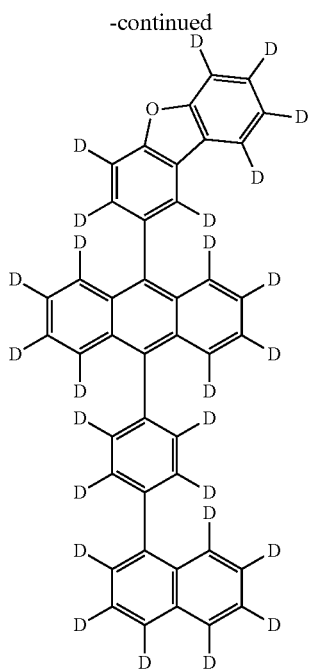

In the organic light emitting device of the present disclosure, the organic material layer includes an electron blocking layer and a light emitting layer, and triplet energy of the electron blocking layer is larger than triplet energy of a host of the light emitting layer.

In order to increase efficiency of fluorescent light emission, triplet-triplet annihilation needs to actively occur in the light emitting layer. For this, triplet energy of the light emitting layer needs to be low to isolate triplet excitons in the light emitting layer, and on the other hand, triplet energy of the electron blocking layer needs to be high to perform a role of preventing triplet energy of the light emitting layer from going over to other layers.

In the specification of the present disclosure, the organic material layer includes one or more light emitting layers.

In the specification of the present disclosure, the organic material layer includes a light emitting layer, and includes anthracene and terminal naphthalene as a host of the light emitting layer, and when carbon connected to the naphthalene in the anthracene is referred to as CA and carbon connected to the anthracene in the naphthalene is referred to as CB, the distance between CA and CB is greater than or equal to 1.0 Å and less than or equal to 6.3 Å.

In the specification of the present disclosure, the distance between CA and CB is greater than or equal to 5.0 Å and less than or equal to 6.3 Å.

In the specification of the present disclosure, the distance between CA and CB is greater than or equal to 5.7 Å and less than or equal to 6.3 Å.

When maintaining the distance between carbon-carbon (CA and CB) at greater than or equal to 5.7 Å and less than or equal to 6.3 Å, the distance between anthracene accumulated by the lengthened molecule may be kept close, which is advantageous for charge transfer.

In the specification of the present disclosure, the organic material layer includes a light emitting layer, and the light emitting layer includes the compound of Chemical Formula 2 as a host of the light emitting layer.

For example, the organic light emitting device of the present disclosure may have a structure as illustrated in FIG. 1, however, the structure is not limited thereto.

FIG. 1 illustrates a structure of the organic light emitting device in which a first electrode (2), an organic material layer (3) and a second electrode (4) are consecutively laminated on a substrate (1). The organic material layer (3) includes a hole transfer layer, an electron blocking layer and a light emitting layer, and an additional organic material layer may be included between the hole transfer layer and the electron blocking layer, and between the electron blocking layer and the light emitting layer.

FIG. 1 illustrates the organic light emitting device, however, the structure is not limited thereto.

FIG. 2 illustrates a structure of the organic light emitting device in which a first electrode (2), a hole transfer layer (6), an electron blocking layer (7), a light emitting layer (8), and a second electrode (4) are consecutively laminated on a substrate (1). Between each of the layers of FIG. 2, an additional organic material layer may be included.

FIG. 3 illustrates a structure of the organic light emitting device in which a first electrode (2), a hole injection layer (5), a hole transfer layer (6), an electron blocking layer (7), a light emitting layer (8), an electron transfer layer (9), an electron injection layer (10) and a second electrode (4) are consecutively laminated on a substrate (1).

FIG. 3 illustrates the organic light emitting device, however, the structure is not limited thereto.

In the specification of the present disclosure, the organic material layer may further include a hole injection layer, a hole transfer layer, or a hole injection and transfer layer.

In the specification of the present disclosure, the organic material layer may further include an electron injection layer, an electron transfer layer, or an electron injection and transfer layer.

The organic light emitting device according to the present specification may be a top-emission type, a bottom-emission type or a dual-emission type depending on the materials used.

The organic light emitting device of the present disclosure may be manufactured using common organic light emitting device manufacturing methods and materials except that one or more organic material layers are formed using the compounds described above.

Preparation Example of Chemical Formula 1

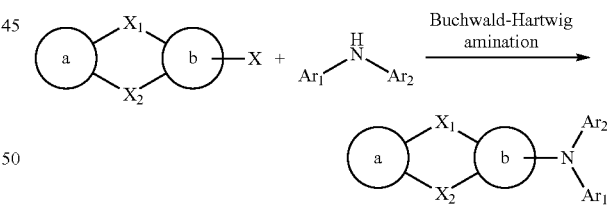

In the preparation example, $Ar_1$, $Ar_2$, $X_1$, $X_2$, a and b have the same definitions as in Chemical Formula 1, and X is a halogen atom.

Preparation Example of Chemical Formula 2

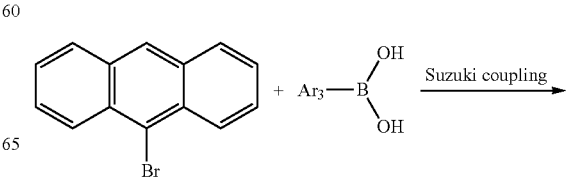

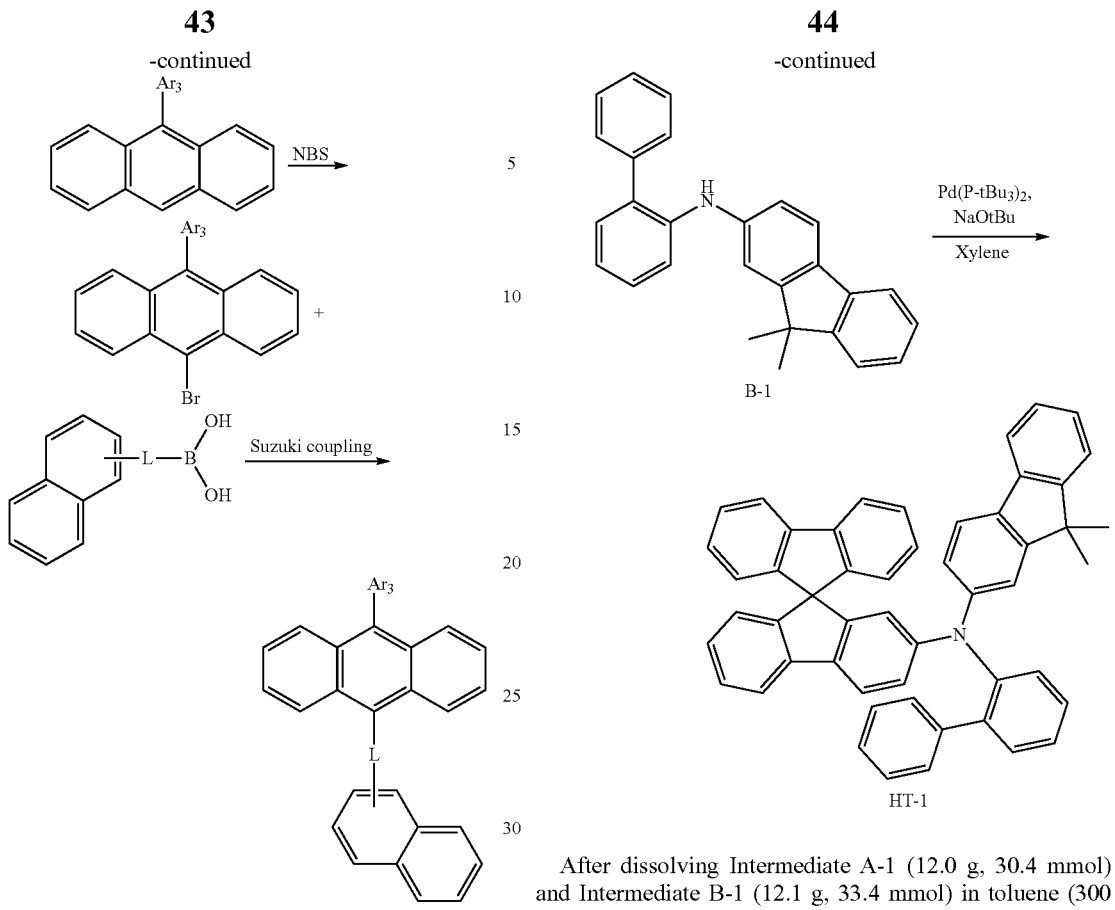

In the preparation example of Chemical Formula 2, L and Ar₃ have the same definitions as in Chemical Formula 2.

The preparation examples and the following synthesis examples are intended to illuminate the present disclosure for those skilled in the art, however, the present disclosure is not limited thereto.

By varying starting materials, intermediates, and types and positions of substituents in the preparation examples and the following synthesis examples, all compounds described in the present disclosure may be prepared.

Synthesis Example

Synthesis Example 1: Synthesis of HT-1

After dissolving Intermediate A-1 (12.0 g, 30.4 mmol) and Intermediate B-1 (12.1 g, 33.4 mmol) in toluene (300 ml), sodium tert-butoxide (8.8 g, 91.1 mmol) and Pd(P(t-Bu)₃)₂ (0.3 g, 0.6 mmol) were introduced thereto, and the result was stirred for 6 hours under the argon atmosphere and a reflux condition. When the reaction was finished, the result was cooled to room temperature, and after introducing water thereto, the reaction solution was transferred to a separatory funnel and extracted. The extracted solution was dried with MgSO₄, filtered and concentrated, and after purifying the sample using silica gel column chromatography, HT-1 (7.2 g) was obtained through sublimation purification. (Yield 35%, MS[M+H]⁺=675)

Synthesis Example 2: Synthesis of HT-2

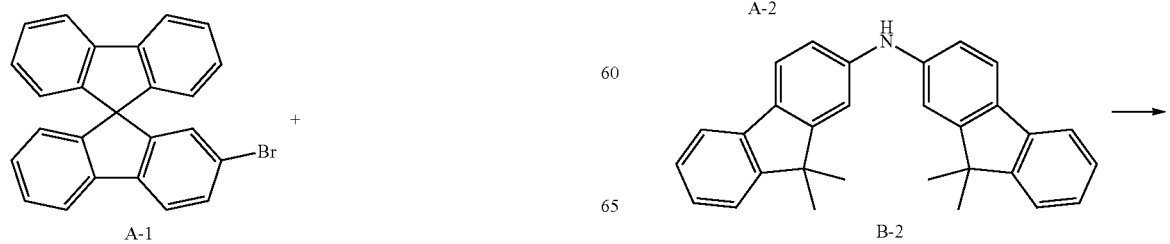

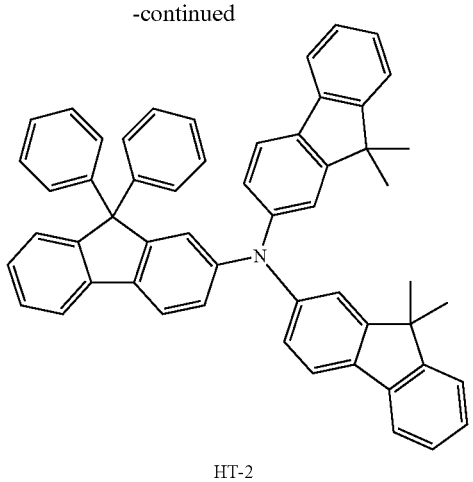

HT-2

HT-2 was prepared in the same manner as in the method for preparing HT-1 except that, in Synthesis Example 1, Intermediate A-1 was changed to Intermediate A-2, and Intermediate B-1 was changed to Intermediate B-2. (MS [M+H]$^+$=717)

Synthesis Example 3: Synthesis of HT-3

HT-3 was prepared in the same manner as in the method for preparing HT-1 except that, in Synthesis Example 1, Intermediate A-1 was changed to Intermediate A-3, and Intermediate B-1 was changed to Intermediate B-3. (MS [M+H]$^+$=748)

Synthesis Example 4: Synthesis of HT-4

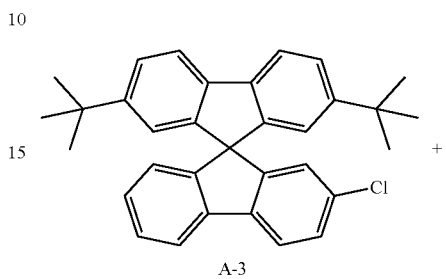

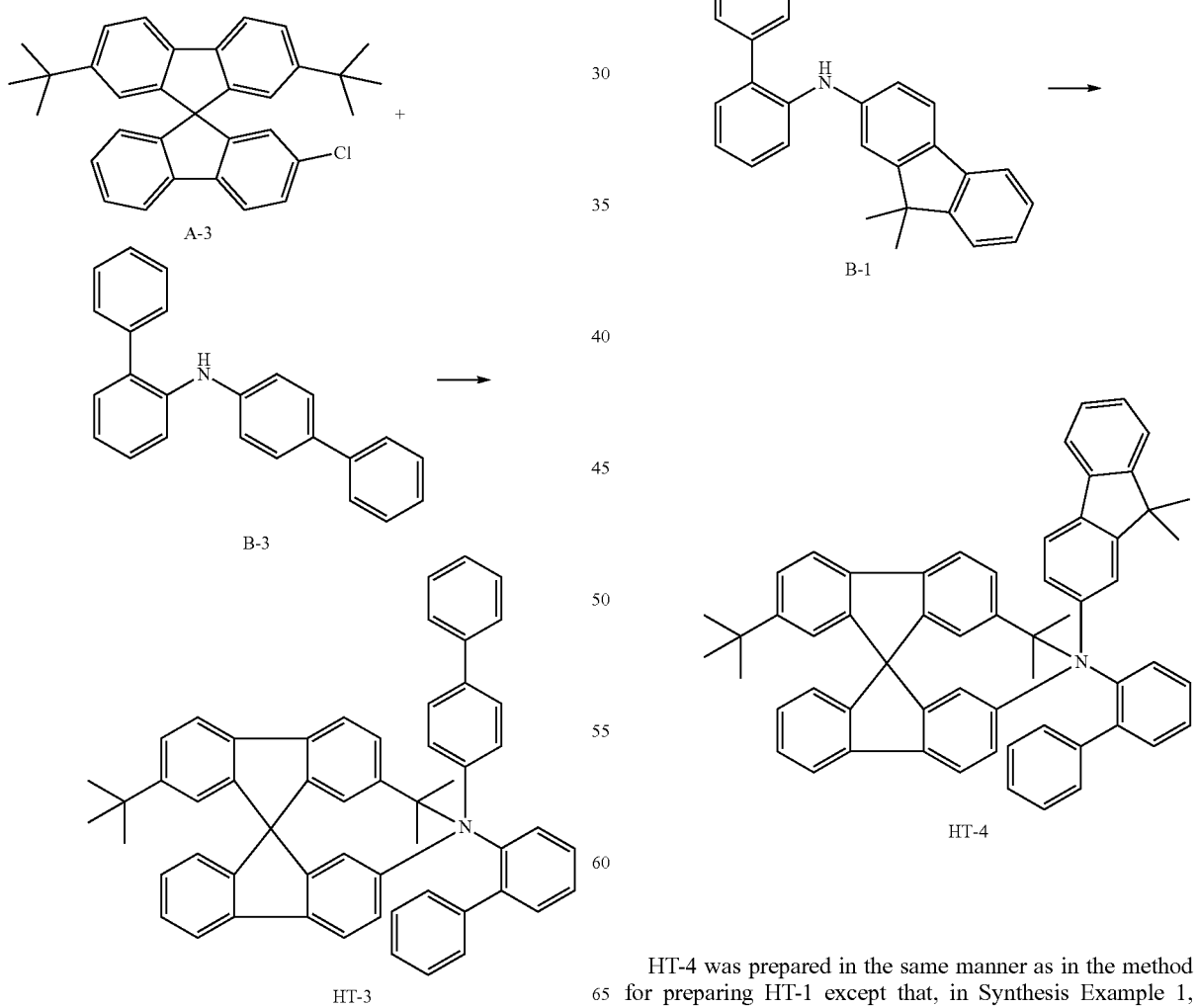

HT-4 was prepared in the same manner as in the method for preparing HT-1 except that, in Synthesis Example 1, Intermediate A-1 was changed to Intermediate A-3. (MS [M+H]$^+$=788)

Synthesis Example 5: Synthesis of EB-1

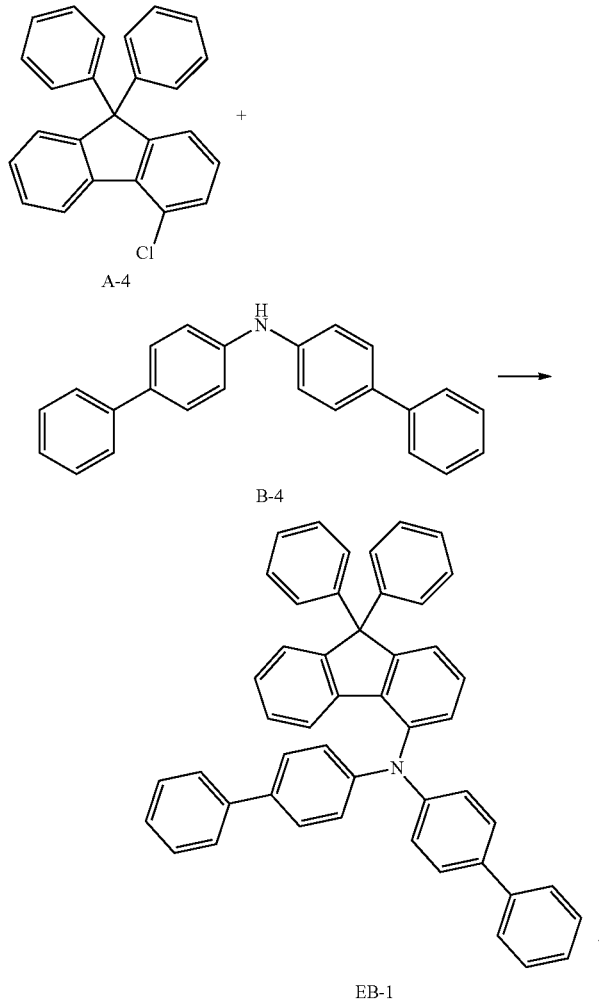

EB-1 was prepared in the same manner as in the method for preparing HT-1 except that, in Synthesis Example 1, Intermediate A-1 was changed to Intermediate A-4, and Intermediate B-1 was changed to Intermediate B-4. (MS [M+H]$^+$=637)

Synthesis Example 6: Synthesis of EB-2

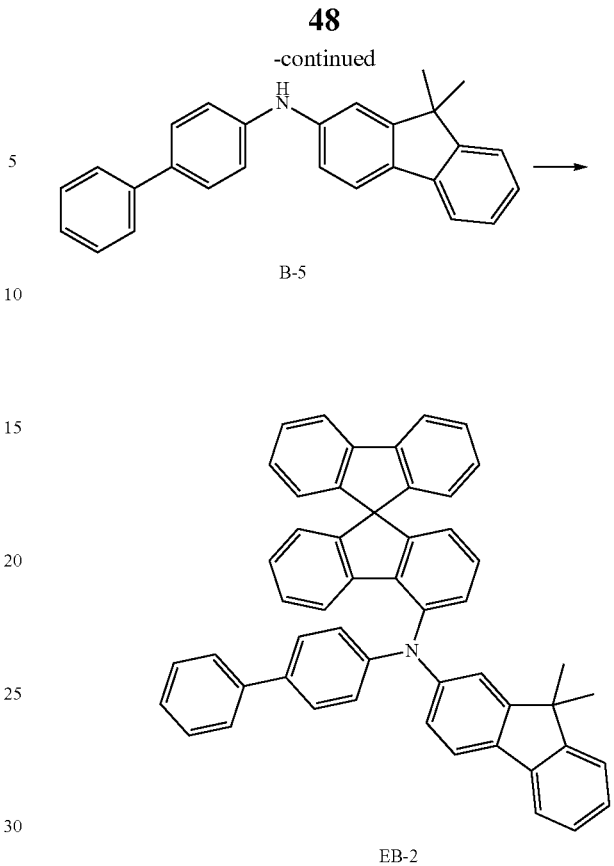

EB-2 was prepared in the same manner as in the method for preparing HT-1 except that, in Synthesis Example 1, Intermediate A-1 was changed to Intermediate A-5, and Intermediate B-1 was changed to Intermediate B-5. (MS [M+H]$^+$=675)

Synthesis Example 7: Synthesis of EB-3

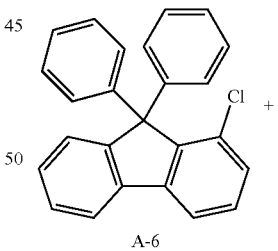

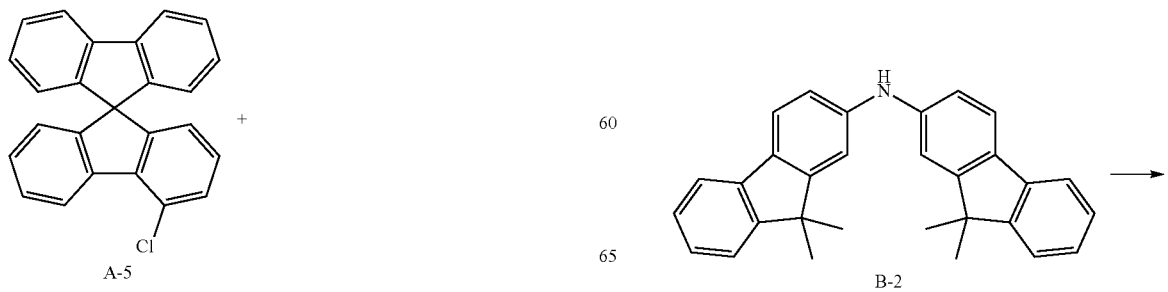

-continued

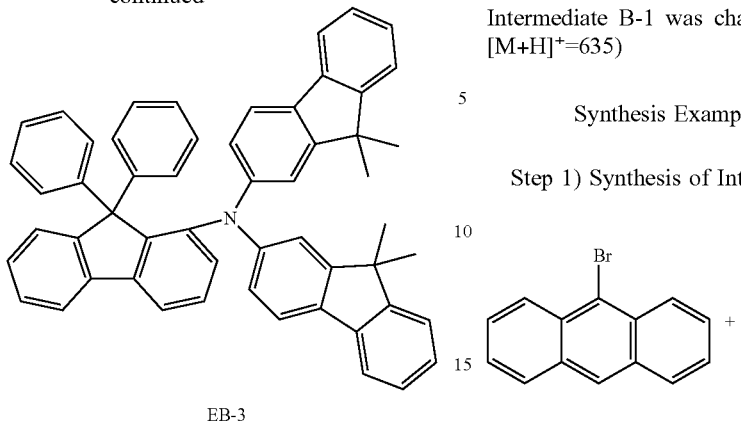

EB-3

EB-3 was prepared in the same manner as in the method for preparing HT-1 except that, in Synthesis Example 1, Intermediate A-1 was changed to Intermediate A-6, and Intermediate B-1 was changed to Intermediate B-2. (MS [M+H]$^+$=717)

Synthesis Example 8: Synthesis of EB-4

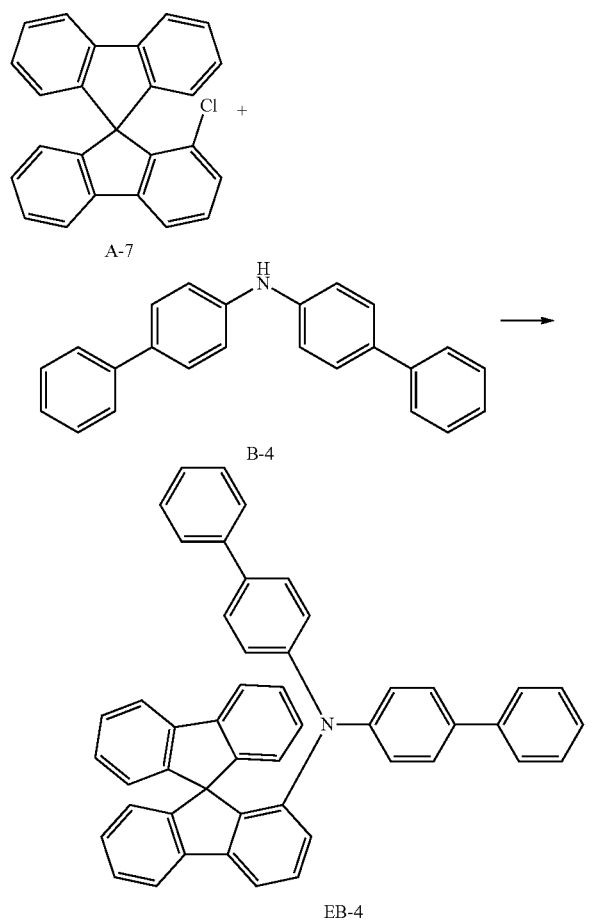

EB-4 was prepared in the same manner as in the method for preparing HT-1 except that, in Synthesis Example 1, Intermediate A-1 was changed to Intermediate A-7, and Intermediate B-1 was changed to Intermediate B-4. (MS [M+H]$^+$=635)

Synthesis Example 9: Synthesis of BH-1

Step 1) Synthesis of Intermediate C-1

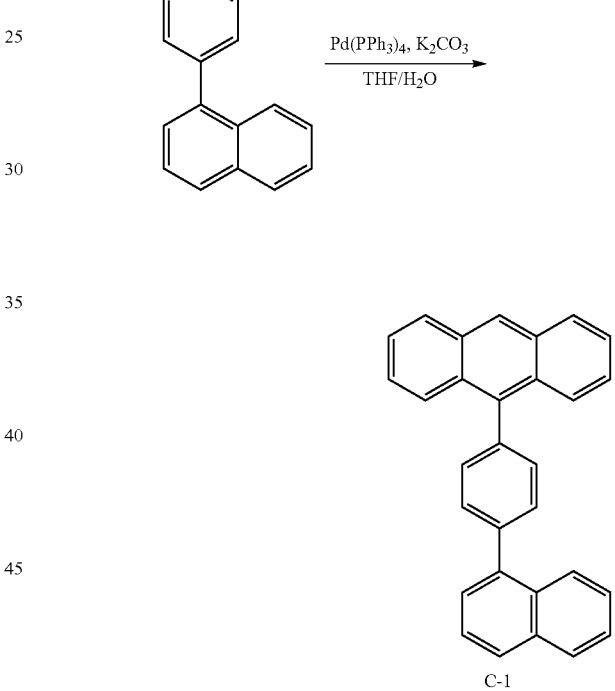

After dissolving 9-bromoanthracene (20.0 g, 77.8 mmol) and (4-(naphthalen-1-yl)phenyl)boronic acid (21.2 g, 85.6 mmol) in THF (300 ml), K$_2$CO$_3$ (43.0 g, 311.1 mmol) dissolved in H$_2$O (150 ml) was introduced thereto. Pd(PPh$_3$)$_4$ (3.6 g, 3.1 mmol) was introduced thereto, and the result was stirred for 8 hours under the argon atmosphere reflux condition. When the reaction was finished, the result was cooled to room temperature, and the reaction solution was transferred to a separatory funnel and extracted with water and ethyl acetate. The extracted solution was dried with MgSO$_4$, filtered and concentrated, and after purifying the sample using silica gel column chromatography, Intermediate C-1 (21.6 g) was obtained. (Yield 73%, MS[M+H]$^+$=380)

Step 2) Synthesis of Intermediate C-2

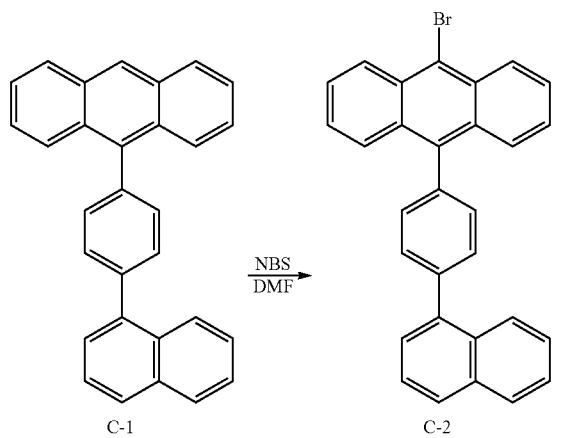

After introducing Intermediate C-1 (20.0 g, 52.6 mmol), NBS (9.8 g, 55.2 mmol) and DMF (400 ml), the result was stirred for 8 hours at room temperature under the argon atmosphere. After the reaction was finished, the reaction solution was transferred to a separatory funnel, and the organic layer was extracted with water and ethyl acetate. The extracted solution was dried with $MgSO_4$, filtered and concentrated, and after purifying the sample using silica gel column chromatography, Intermediate C-2 (21.0 g) was obtained. (Yield 87%, MS[M+H]$^+$=459)

Step 3) Synthesis of BH-1

After dissolving Intermediate C-2 (15.0 g, 32.7 mmol) and phenylboronic acid (4.4 g, 35.9 mmol) in THF (225 ml), $K_2CO_3$ (18.1 g, 130.6 mmol) dissolved in $H_2O$ (113 ml) was introduced thereto. $Pd(PPh_3)_4$ (1.5 g, 1.3 mmol) was introduced thereto, and the result was stirred for 8 hours under the argon atmosphere reflux condition. When the reaction was finished, the result was cooled to room temperature, and the reaction solution was transferred to a separatory funnel and extracted with water and ethyl acetate. The extracted solution was dried with $MgSO_4$, filtered and concentrated, and after purifying the sample using silica gel column chromatography, BH-1 (4.8 g) was obtained through sublimation purification. (Yield 32%, MS[M+H]+=456)

Synthesis Example 10: Synthesis of BH-2

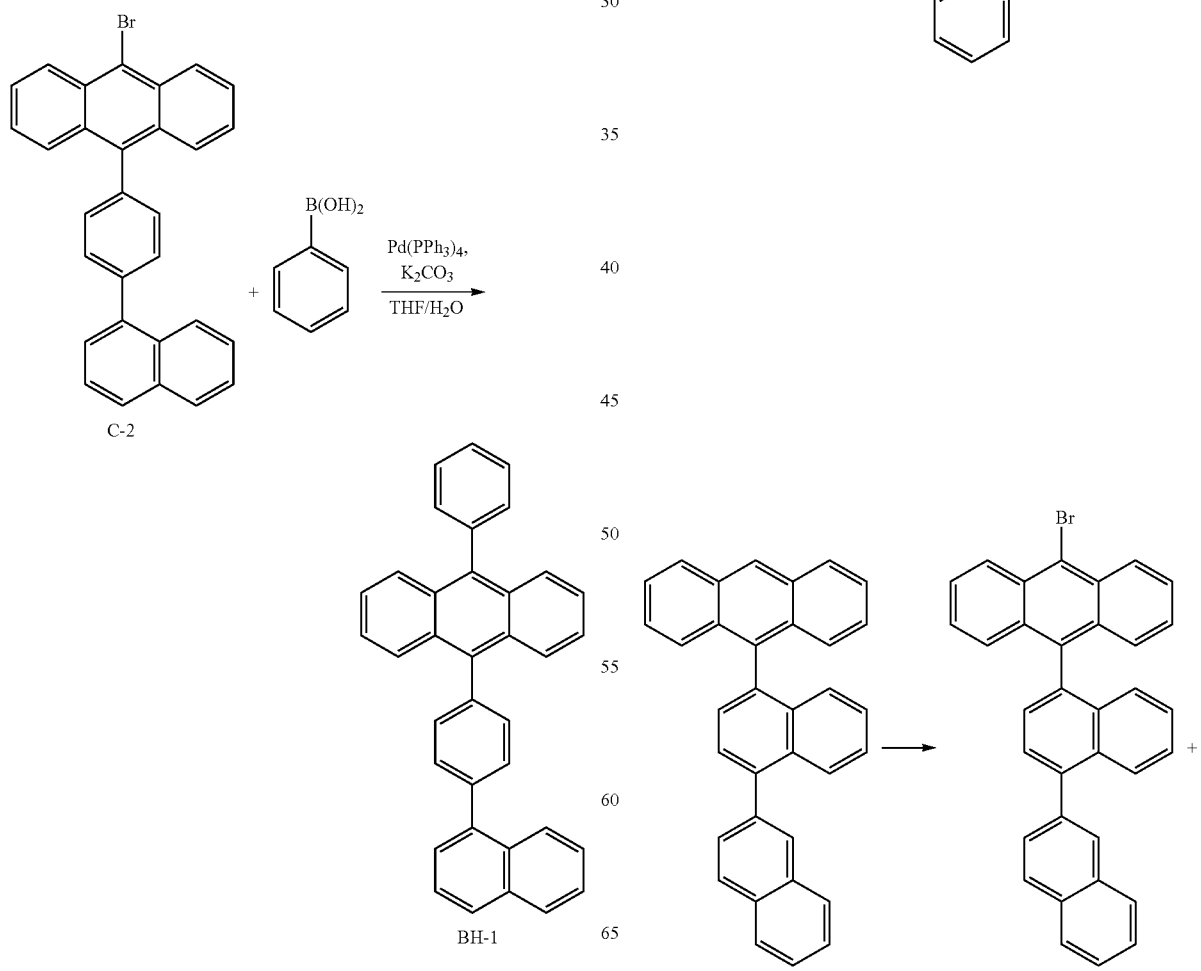

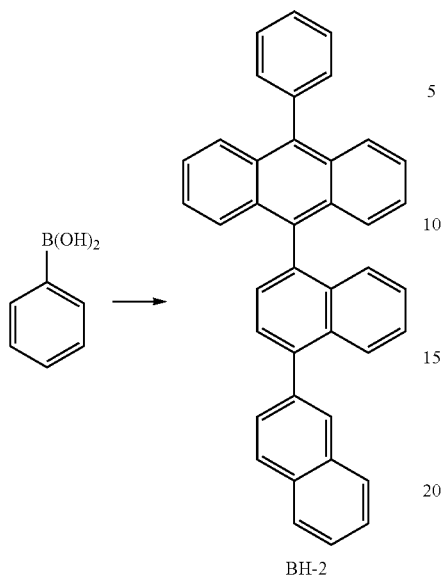

BH-2

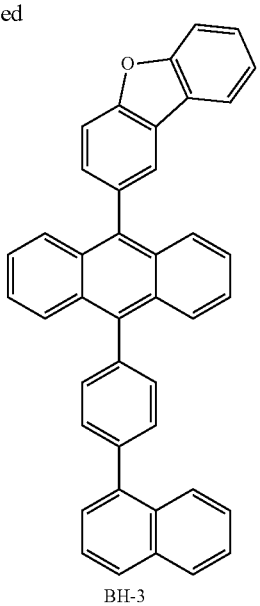

BH-3

BH-2 was prepared in the same manner as in the method for preparing BH-1 except that, in Synthesis Example 9, (4-(naphthalen-1-yl)phenyl)boronic acid was changed to [1,2'-binaphthalen]-4-ylboronic acid. (MS[M+H]⁺=506)

Synthesis Example 11: Synthesis of BH-3

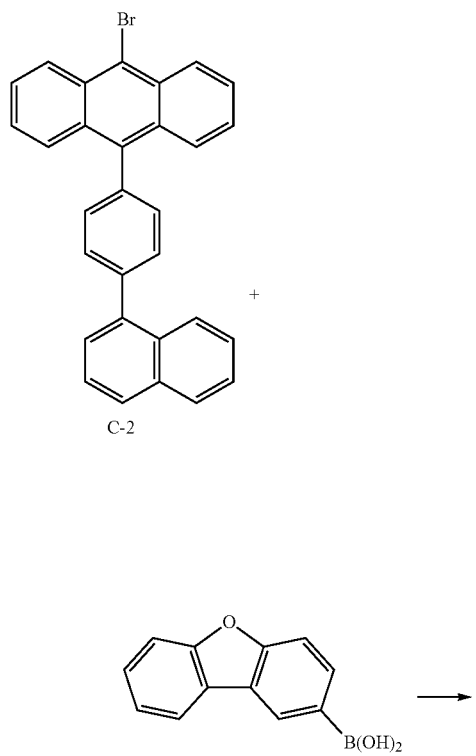

C-2

BH-3 was prepared in the same manner as in the method for preparing BH-1 except that, in Step 3 of Synthesis Example 9, phenylboronic acid was changed to dibenzo[b,d]furan-2-ylboronic acid. (MS[M+H]⁺=546)

EXAMPLE

Example 1

A glass substrate on which indium tin oxide (ITO) was coated as a thin film to a thickness of 1,400 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum depositor.

On the transparent ITO electrode prepared as above, a hole injection layer was formed by thermal vacuum depositing the following HT-1 and PD in a weight ratio of 95:5 to a thickness of 100 Å, and then a hole transfer layer was formed thereon by depositing only a HT-1 material to a thickness of 1100 Å. A compound of the following EB-1 was thermal vacuum deposited thereon to a thickness of 50 Å as an electron blocking layer. Subsequently, compounds of the following BH-1 and BD were vacuum deposited in a weight ratio of 96:4 to a thickness of 200 Å as a light emitting layer. Subsequently, compounds of the following ET and Liq were thermal vacuum deposited in a weight ratio of 1:1 to a thickness of 360 Å as an electron transfer layer, and then a compound of the following Liq was vacuum deposited thereon to a thickness of 5 Å to form an electron injection layer. On the electron injection layer, a cathode was formed by consecutively depositing magnesium and silver in a weight ratio of 10:1 to a thickness of 220 Å and aluminum to a thickness of 1000 Å, and as a result, an organic light emitting device was manufactured.

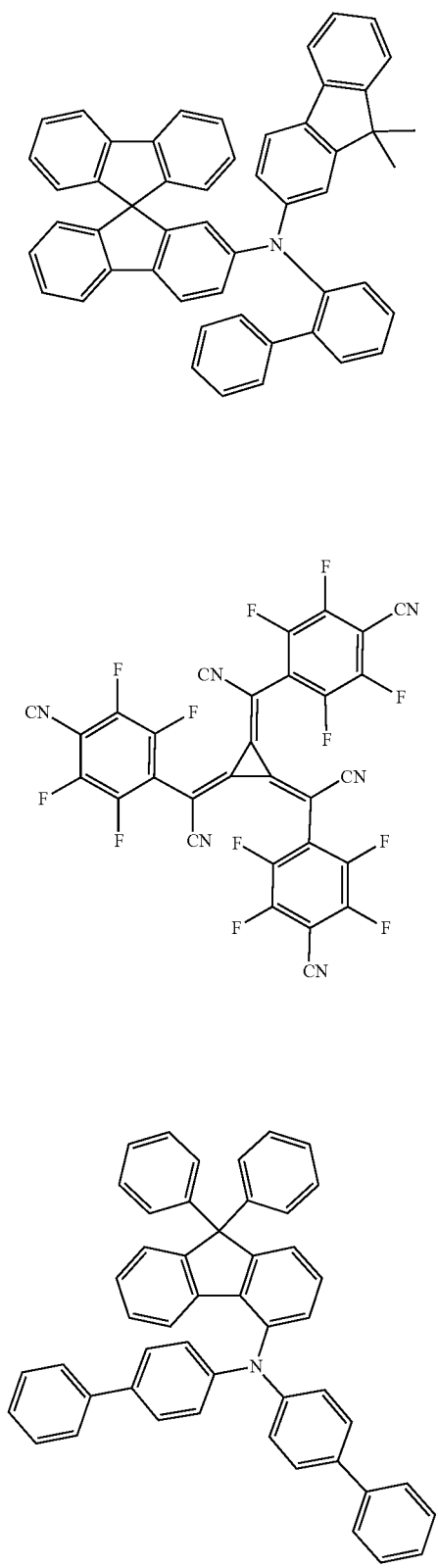

HT-1

PD

EB-1

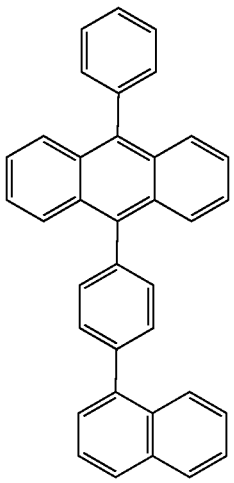

BH-1

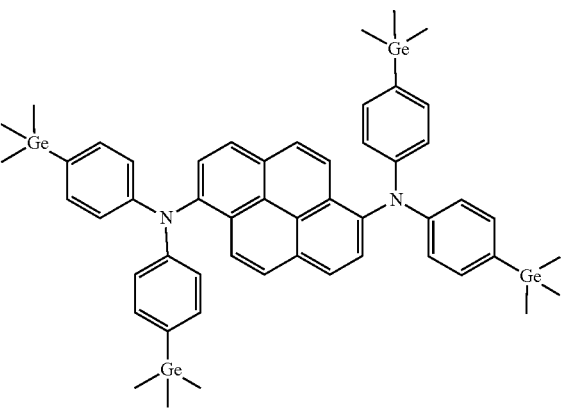

BD

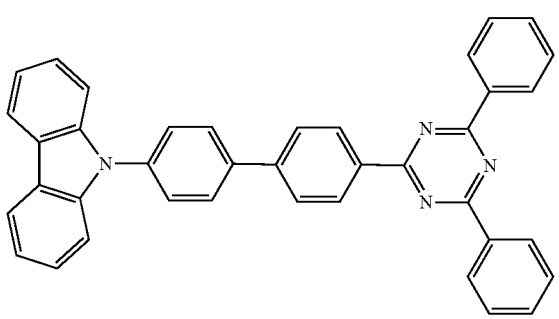

RT

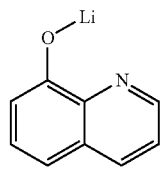

Liq

Examples 2 to 16 and Comparative Examples 1 to 13

Organic light emitting devices were manufactured in the same manner as in Example 1, except that compounds described in the following Table 1 were used instead as the hole transfer layer material, the electron blocking layer material and the host material in Example 1.

HT-2
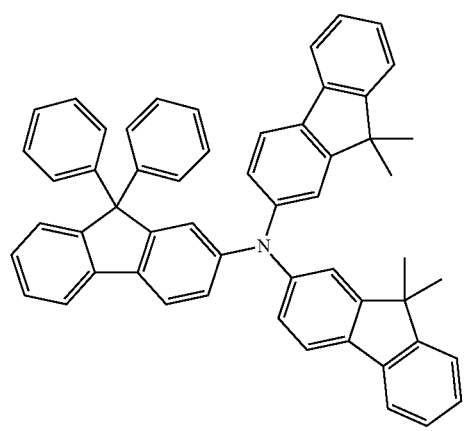
EB-2
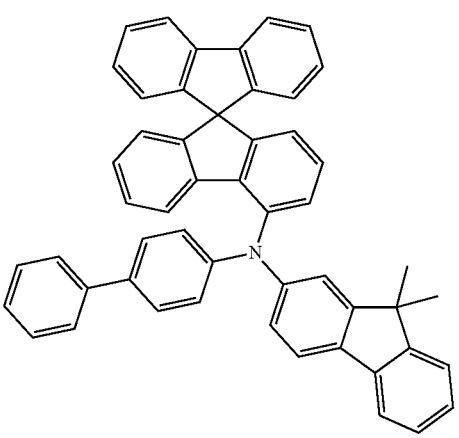
HT-3
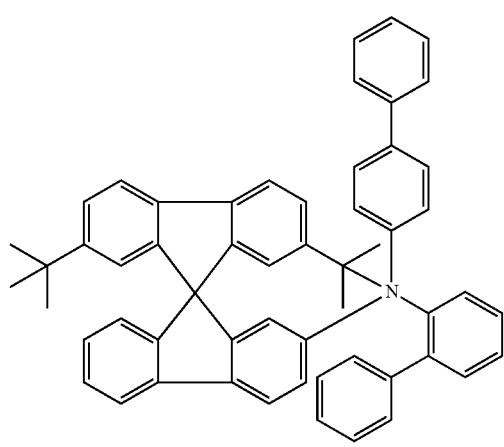
EB-3
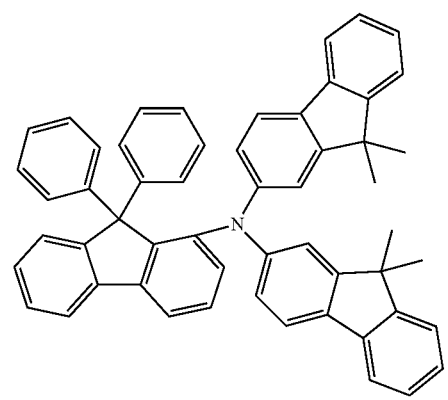
HT-4
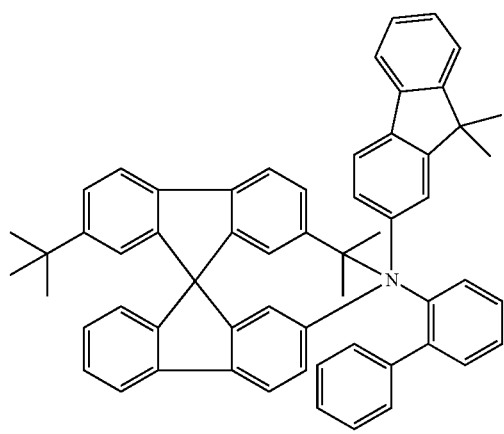
EB-4
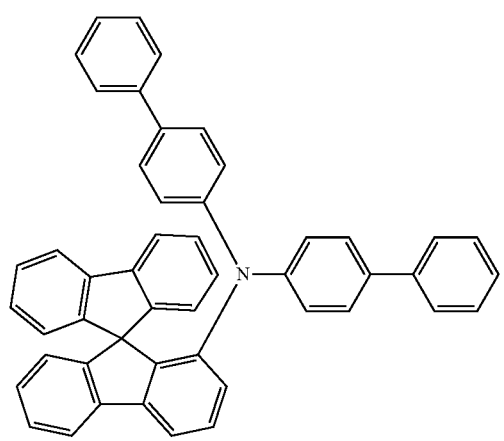

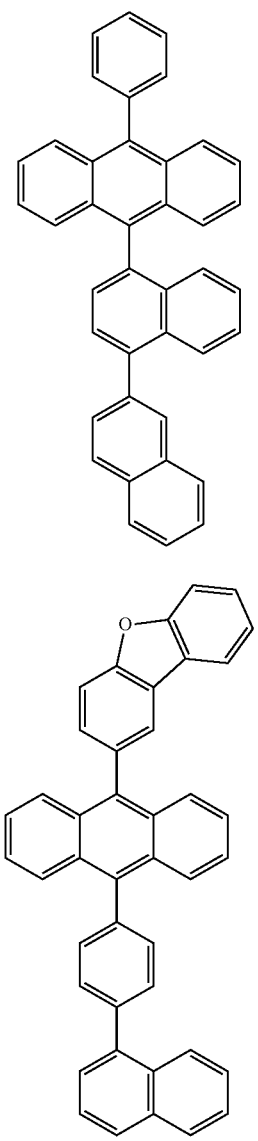

BH-2

BH-3

BH-A

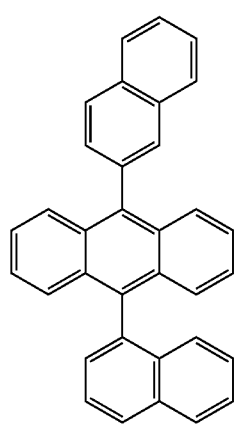

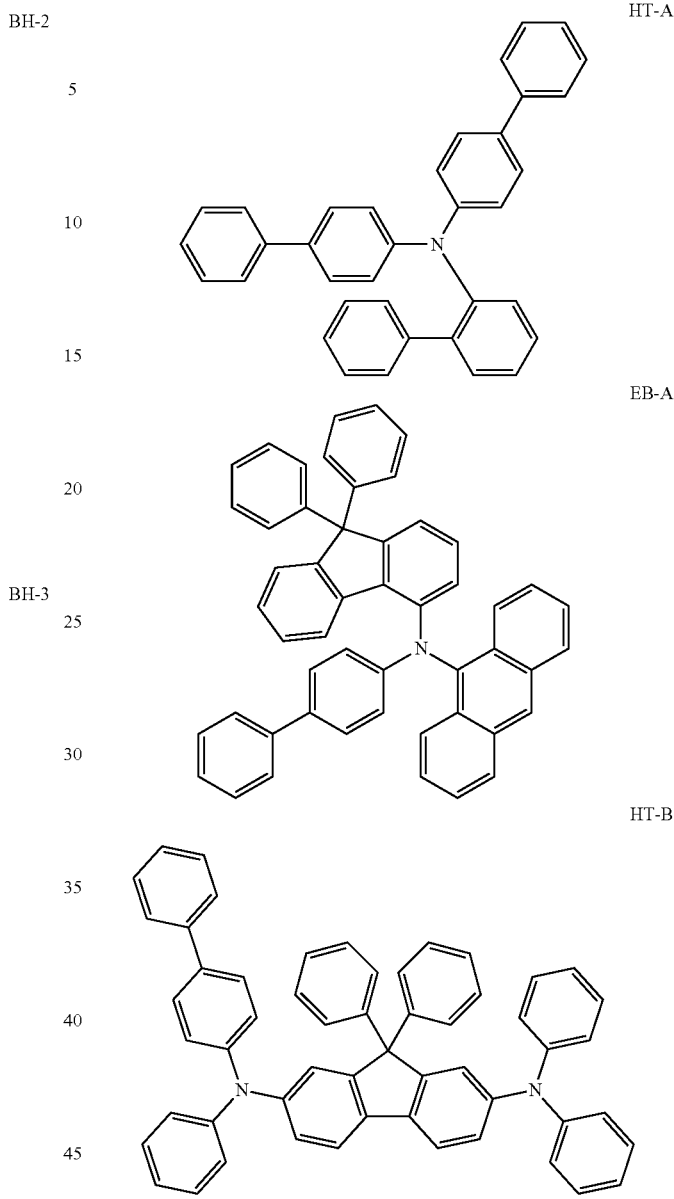

HT-A

EB-A

HT-B

For each of the organic light emitting devices manufactured in the examples and the comparative examples, device performance when applying current density of 10 mA/cm² was measured, and time taken for initial luminance decreasing to 90% at current density of 20 mA/cm² was measured, and obtained results are shown in Table 1.

TABLE 1

| Example | Hole Transfer Layer | Electron Blocking Layer | Host | @10 mA/cm² V | @10 mA/cm² cd/A | @20 mA/cm² Lifetime (hr) |
|---|---|---|---|---|---|---|
| Example 1 | HT-1 | EB-1 | BH-1 | 3.99 | 5.11 | 153 |
| Example 2 | HT-2 | EB-1 | BH-1 | 3.91 | 5.18 | 150 |
| Example 3 | HT-3 | EB-1 | BH-1 | 3.95 | 5.16 | 163 |
| Example 4 | HT-4 | EB-1 | BH-1 | 3.98 | 5.11 | 149 |
| Example 5 | HT-1 | EB-2 | BH-1 | 4.02 | 5.1 | 152 |
| Example 6 | HT-1 | EB-3 | BH-1 | 4.05 | 5.14 | 154 |

TABLE 1-continued

| Example | Hole Transfer Layer | Electron Blocking Layer | Host | @10 mA/cm² V | @10 mA/cm² cd/A | @20 mA/cm² Lifetime (hr) |
|---|---|---|---|---|---|---|
| Example 7 | HT-1 | EB-4 | BH-1 | 4.08 | 5.11 | 163 |
| Example 8 | HT-1 | EB-1 | BH-2 | 4.07 | 5.13 | 160 |
| Example 9 | HT-1 | EB-1 | BH-3 | 3.99 | 5.17 | 148 |
| Example 10 | HT-2 | EB-2 | BH-1 | 4.00 | 5.11 | 154 |
| Example 11 | HT-2 | EB-2 | BH-2 | 3.98 | 5.16 | 158 |
| Example 12 | HT-2 | EB-3 | BH-3 | 3.97 | 5.03 | 143 |
| Example 13 | HT-3 | EB-3 | BH-1 | 4.08 | 5.05 | 149 |
| Example 14 | HT-3 | EB-4 | BH-2 | 4.04 | 5.02 | 140 |
| Example 15 | HT-4 | EB-3 | BH-2 | 4.11 | 5.09 | 131 |
| Example 16 | HT-4 | EB-4 | BH-3 | 4.10 | 5.06 | 133 |
| Comparative Example 1 | HT-A | EB-1 | BH-1 | 8.64 | 1.77 | 10 |
| Comparative Example 2 | HT-1 | EB-A | BH-1 | 4.63 | 2.98 | 82 |
| Comparative Example 3 | HT-1 | EB-A | BH-3 | 4.51 | 2.19 | 78 |
| Comparative Example 4 | HT-2 | EB-A | BH-2 | 4.78 | 2.86 | 93 |
| Comparative Example 5 | HT-4 | EB-A | BH-3 | 4.53 | 2.88 | 77 |
| Comparative Example 6 | HT-3 | EB-3 | BH-A | 3.95 | 4.85 | 101 |
| Comparative Example 7 | HT-4 | EB-4 | BH-A | 4.01 | 4.65 | 110 |
| Comparative Example 8 | HT-1 | HT-1 | BH-1 | 4.68 | 2.88 | 30 |
| Comparative Example 9 | HT-2 | HT-2 | BH-2 | 4.59 | 2.69 | 37 |
| Comparative Example 10 | EB-1 | EB-1 | BH-2 | 6.19 | 2.43 | 7 |
| Comparative Example 11 | EB-4 | EB-4 | BH-3 | 6.05 | 2.26 | 14 |
| Comparative Example 12 | HT-B | EB-1 | BH-1 | 4.07 | 3.28 | 110 |
| Comparative Example 13 | HT-1 | HT-B | BH-1 | 7.51 | 1.81 | 5 |

For the hole transfer layer material, the electron blocking layer material and the light emitting layer host material used in the examples and the comparative examples, triplet energy was calculated through quantum calculation, and the results are shown in Table 2. As the quantum calculation, structure optimization was progressed through a density functional theory (DFT) of the Schrodinger Material Science Suite program, and then triplet energy was obtained through a time dependent-density functional theory (TD-DFT) calculation. Herein, B3LYP was used as a function, and 6-31G* was used as a basis function.

TABLE 2

| Material | T1 (eV) |
|---|---|
| HT-1 | 2.62 |
| HT-2 | 2.58 |
| HT-3 | 2.66 |
| HT-4 | 2.83 |
| HT-A | 2.80 |
| EB-1 | 2.82 |
| EB-2 | 2.70 |
| EB-3 | 2.69 |
| EB-4 | 2.86 |
| EB-A | 1.69 |
| BH-1 | 1.73 |
| BH-2 | 1.73 |
| BH-3 | 1.73 |
| BH-A | 1.73 |

When comparing Comparative Examples 1 to 7, Examples 7 and 8 and the like, it was seen that a sufficient effect of long lifetime was able to be obtained just by using the compound of the present disclosure in each of the hole transfer layer, the electron blocking layer and the light emitting layer.

When using the compound of Chemical Formula 1 of the present disclosure in the hole transfer layer and the electron blocking layer, properties advantageous for hole injection and migration may be obtained due to a similar structure. Particularly, when using the compound in each of the layers while varying the position of substitution of the amine group, the properties may be controlled to properties proper for the role of each layer. When comparing Comparative Examples 10 and 11 with Examples 4 and 7, it was seen that a significant long lifetime was obtained when using a different compound in the hole transfer layer and the electron blocking layer compared to when using the same compound.

In addition, when using the structure of Chemical Formula 2 as the host material, the angle between anthracene and L of Chemical Formula 2 is vertical, and the conjugation length may be controlled to be short and the distance between the anthracene accumulated by the lengthened molecule may be kept close, which is advantageous for charge transfer.

In the fused aryl group, triplet energy decreases as the number of fused rings increases. Since the structure of Chemical Formula 2 used as the light emitting layer host includes an anthracene structure, triplet energy may be smaller than the light emitting layer host when the structure of Chemical Formula 1 includes a functional group including three or more 6-membered rings such as anthracene.

Accordingly, in Comparative Examples 2 to 5 using EB-A, triplet energy of the material used in a layer in contact with the light emitting layer became smaller than the triplet energy of the light emitting layer host material, and charges were out of the light emitting layer since the role as a blocking layer was not able to be performed, and as a result, the lifetime decreases.

Even when maintaining the structure of Chemical Formula 1, the material used as the electron blocking layer needs to have greater triplet energy than the light emitting layer host material in order to perform a role as a blocking layer. EB-A of Table 2 has smaller triplet energy compared to other materials, and particularly, has smaller triplet energy even than the host material, and it was seen that device efficiency decreased since the role as a blocking layer was not performed in this case. When considering such results, the organic electroluminescent device satisfying conditions of the present disclosure is capable of obtaining properties of low voltage, high efficiency and long lifetime.

A material such as HT-B having two amine groups used in Comparative Example 12 and Comparative Example 13 has an increased HOMO level compared to the structure of Chemical Formula 1 as the amine group performing a role of an electron donor is added. When using the material in the hole transfer layer as in Comparative Example 12, a low driving voltage was obtained since there was no problem in hole injection, however, there was too much hole injection in the light emitting layer resulting in decreased efficiency since the light emitting region moved in the electron transfer layer direction. Meanwhile, when using HT-B in the electron blocking layer as in Comparative Example 13, it was seen that a difference in the HOMO level between the electron blocking layer and the light emitting layer increased preventing hole injection to the light emitting layer, and as a result, all device properties declined.

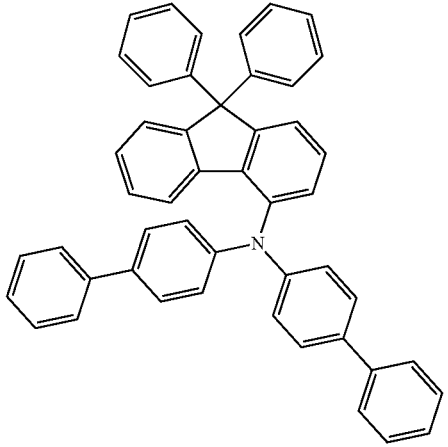

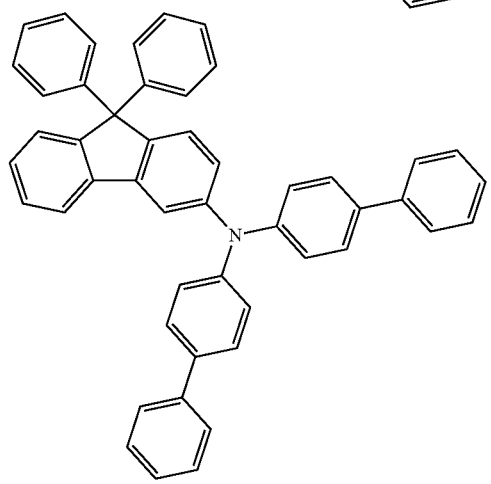

67
-continued
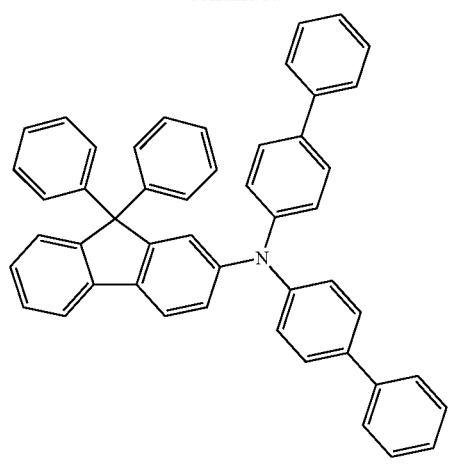
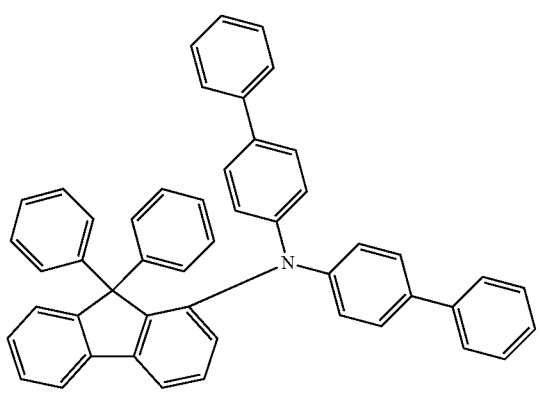
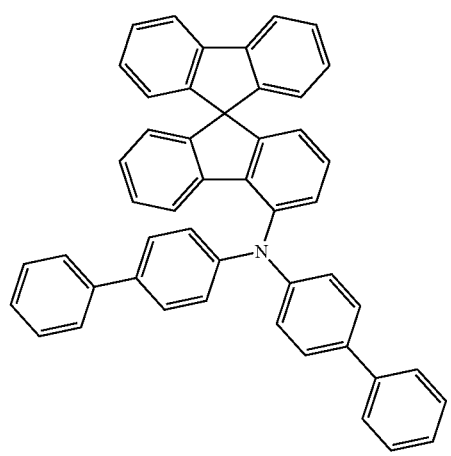
68
-continued
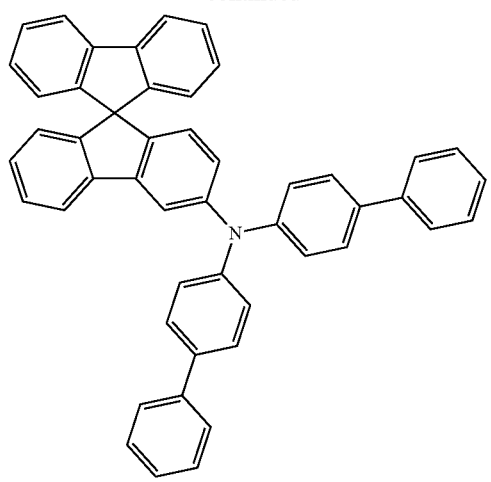
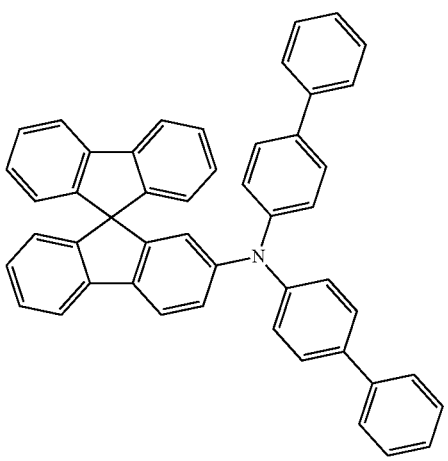
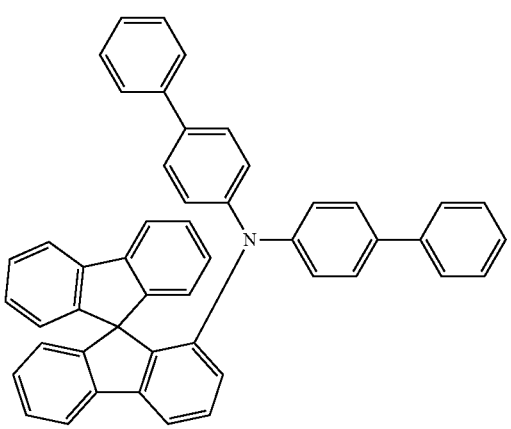

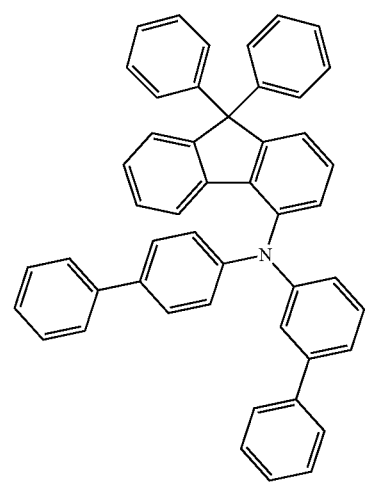
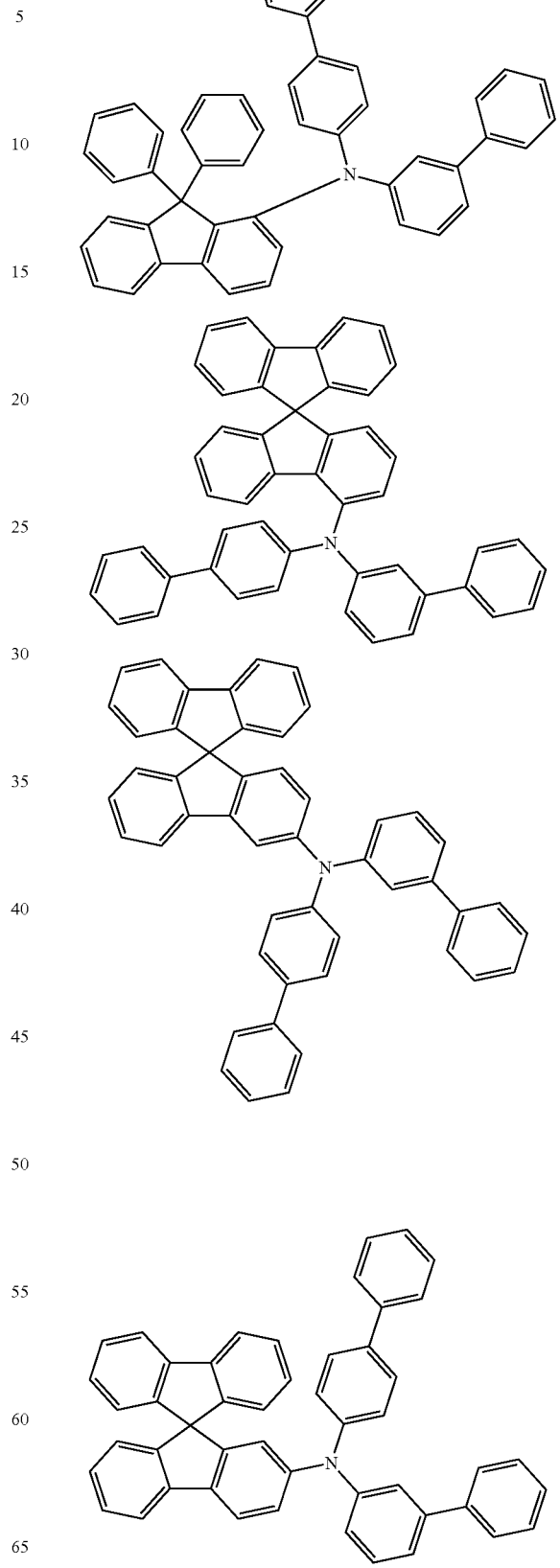

-continued
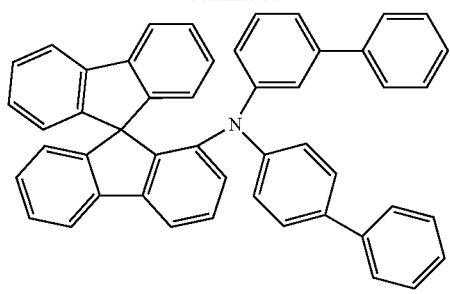
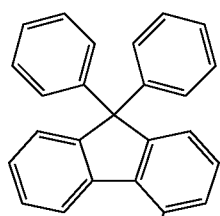
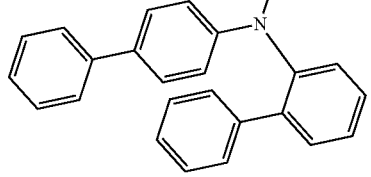
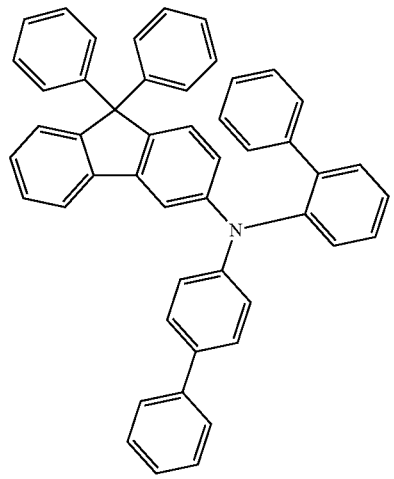
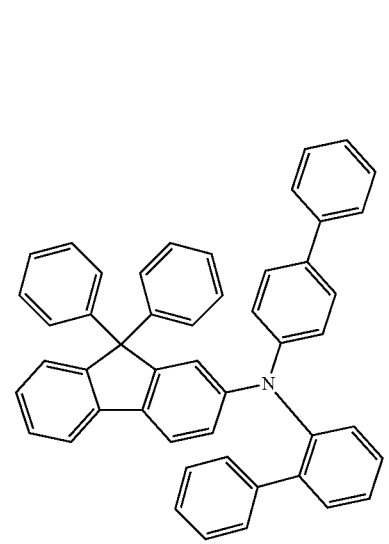
-continued
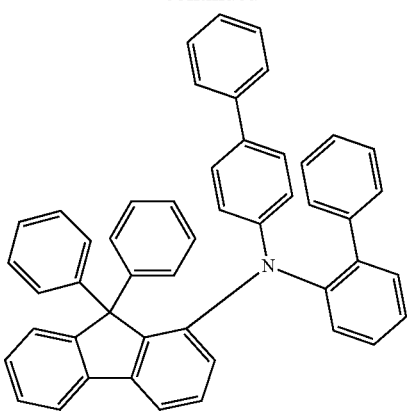
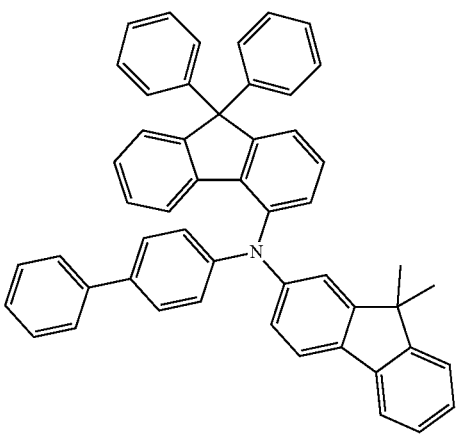
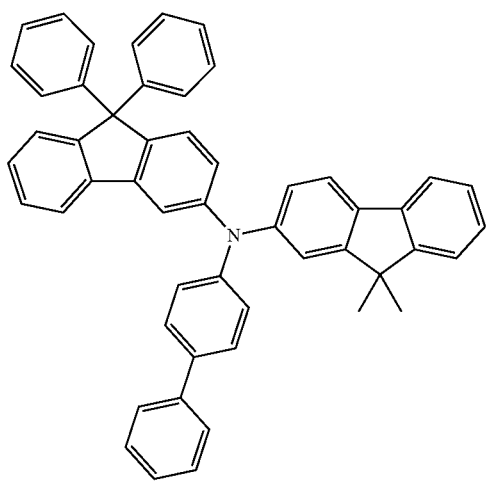

73
-continued
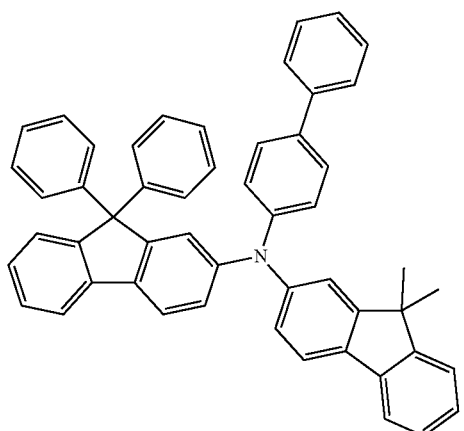
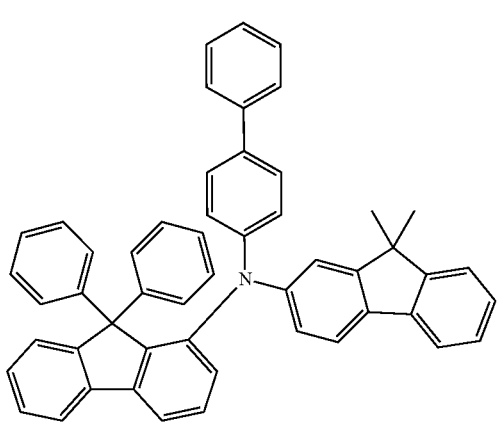
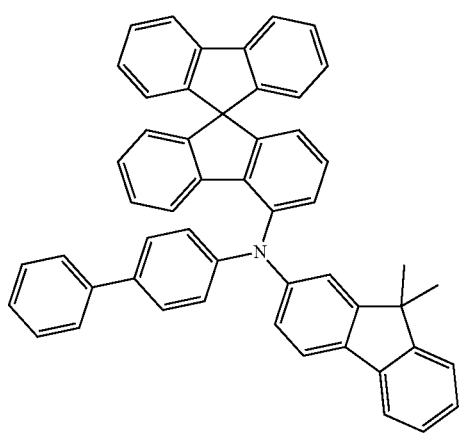
74
-continued
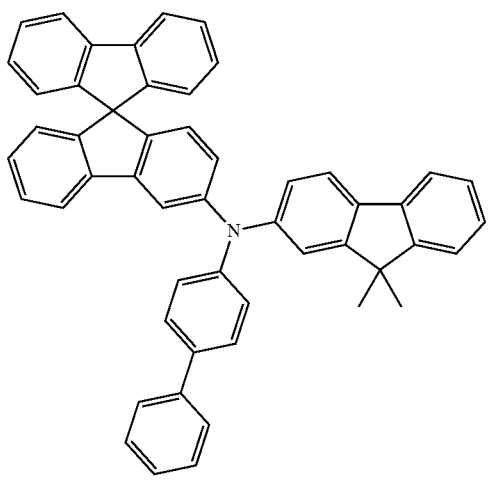
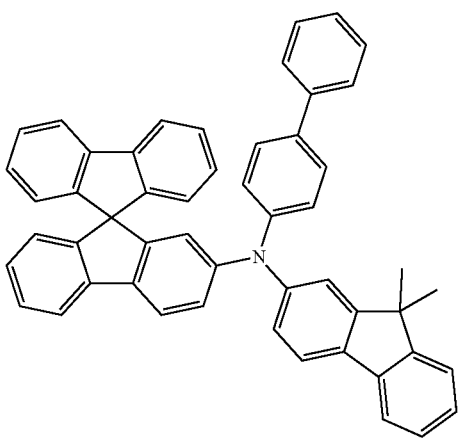
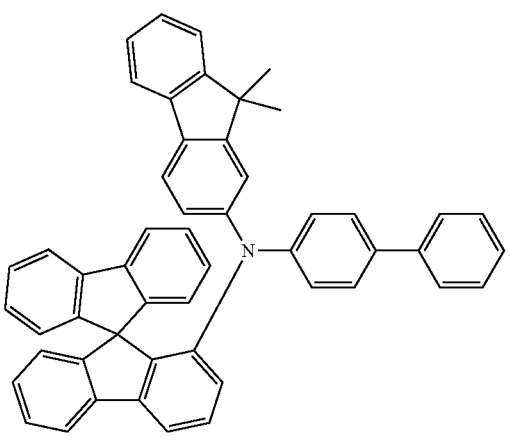

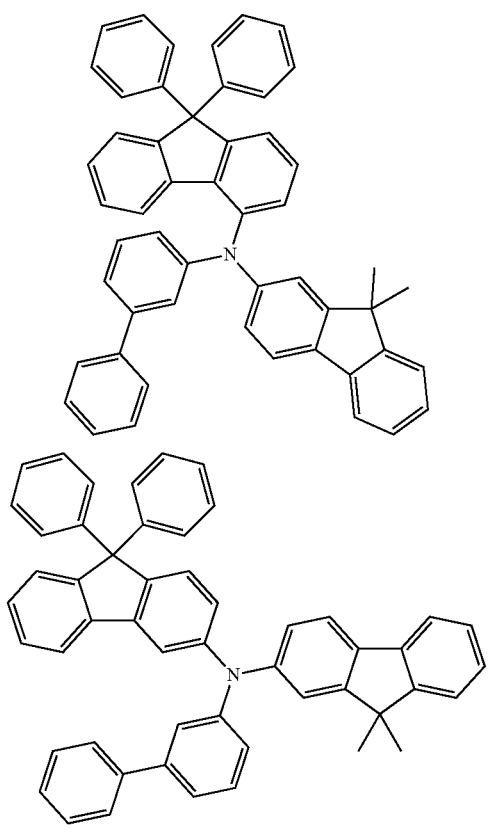
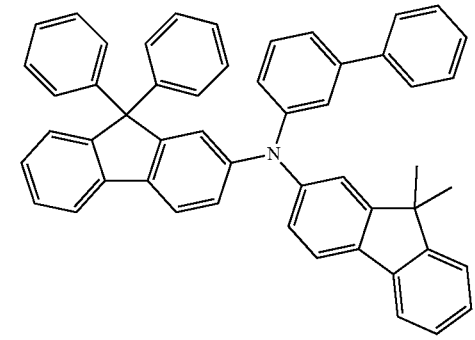
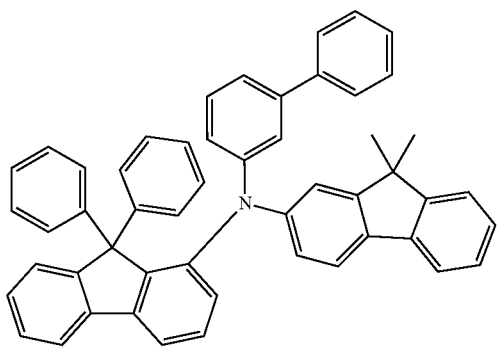
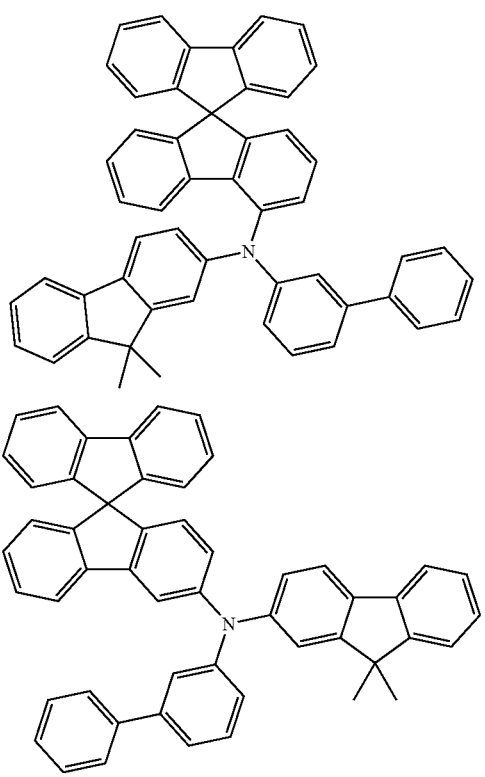
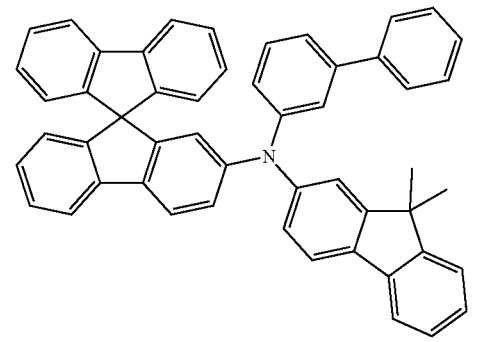
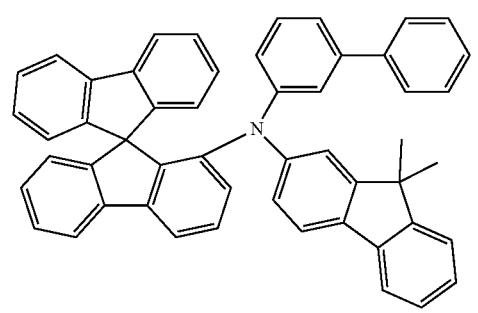

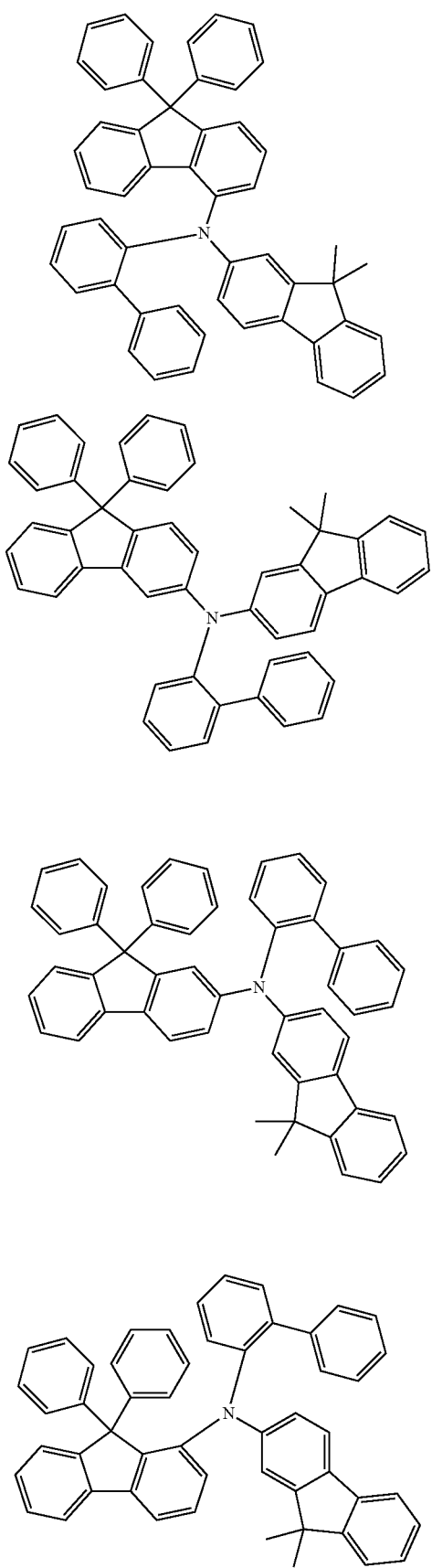
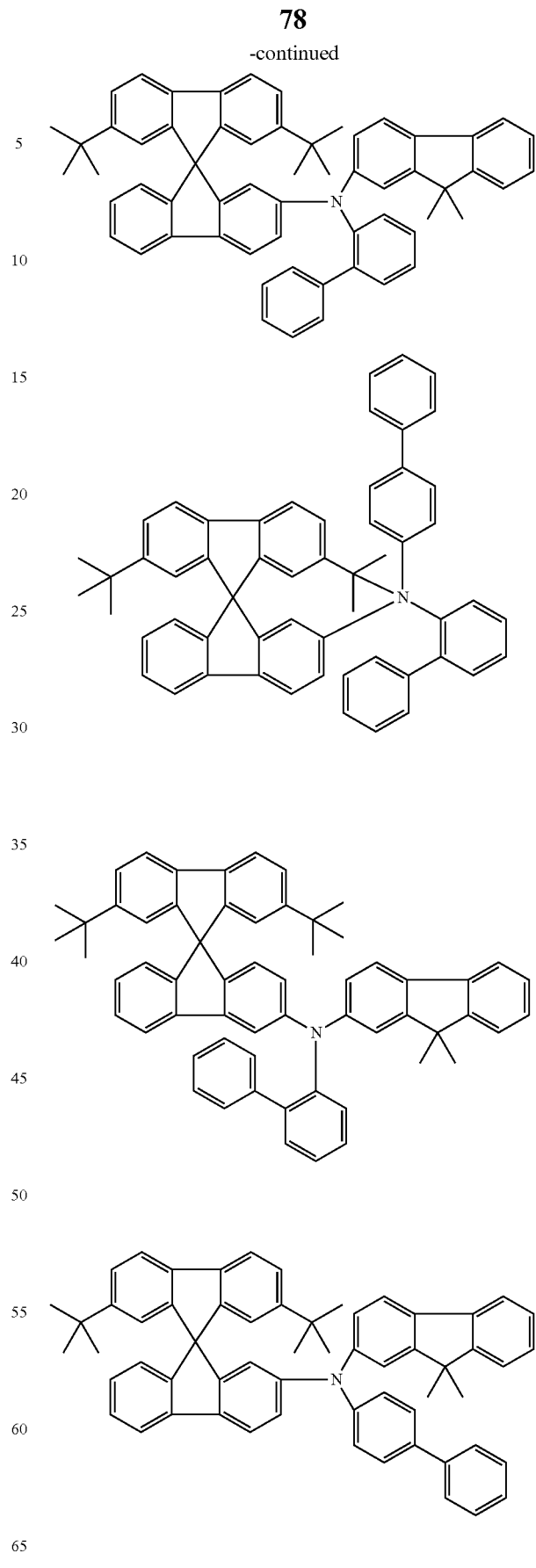

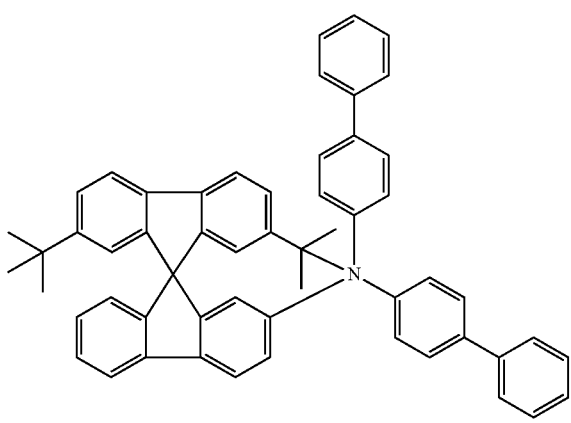
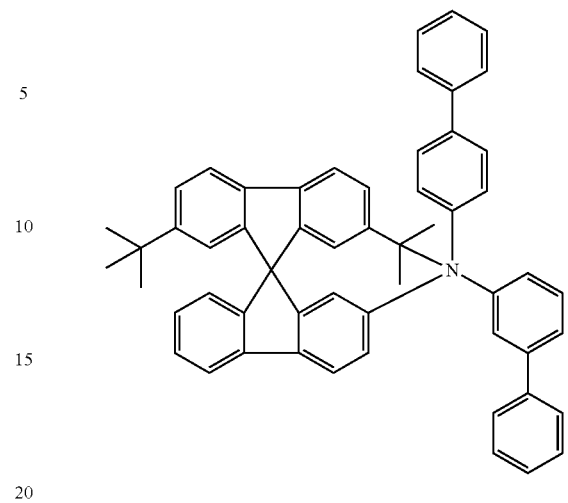
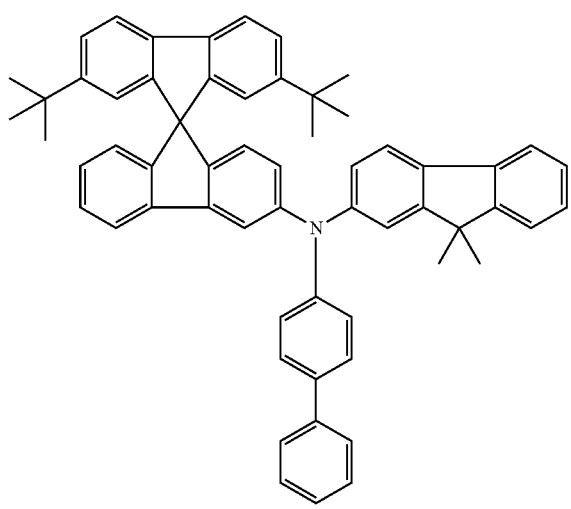
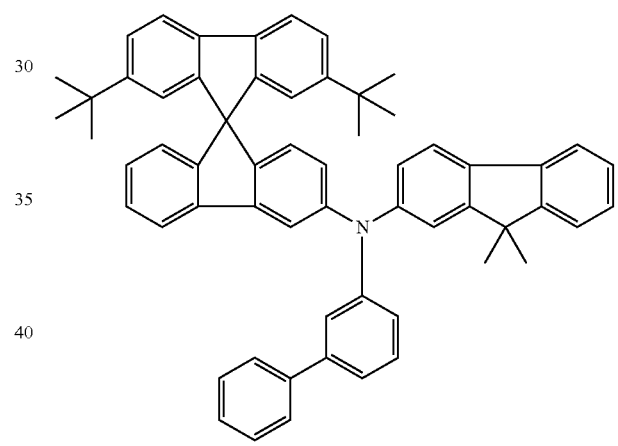
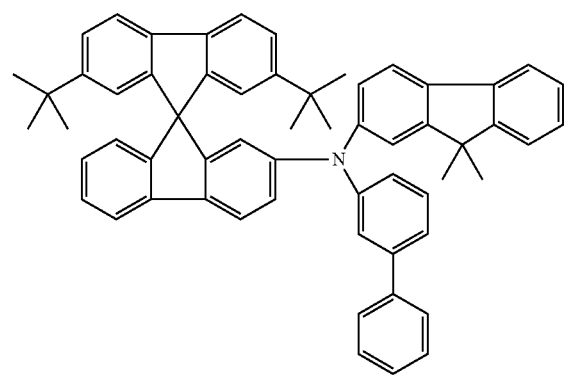
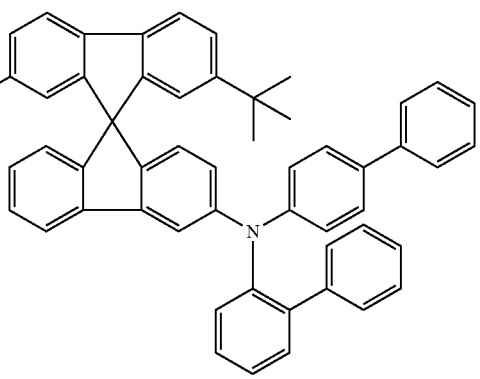

US 11,864,460 B2
81
-continued
82
-continued
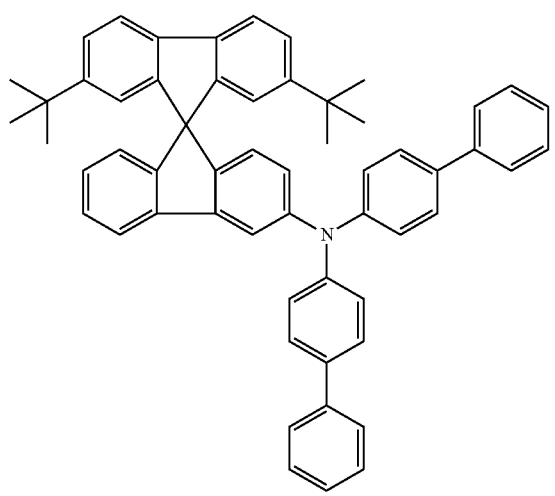
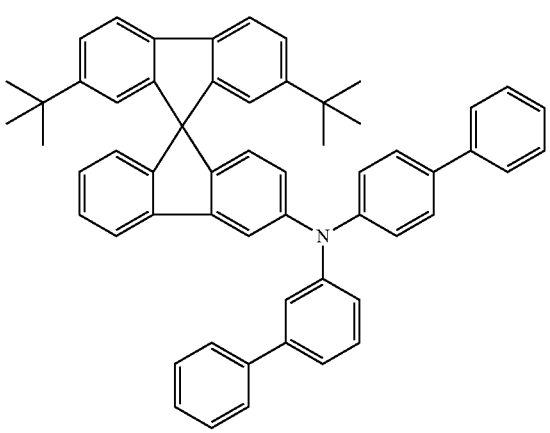

83
-continued
84
-continued
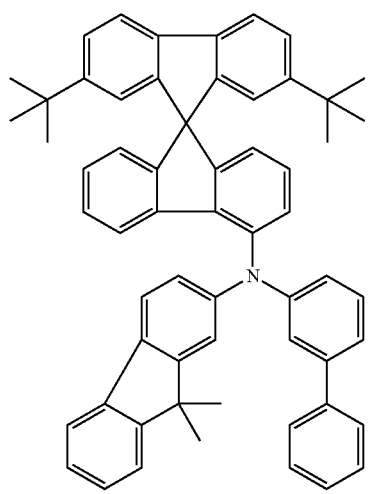
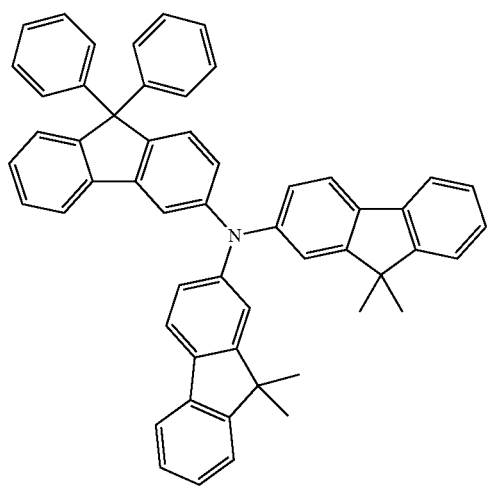
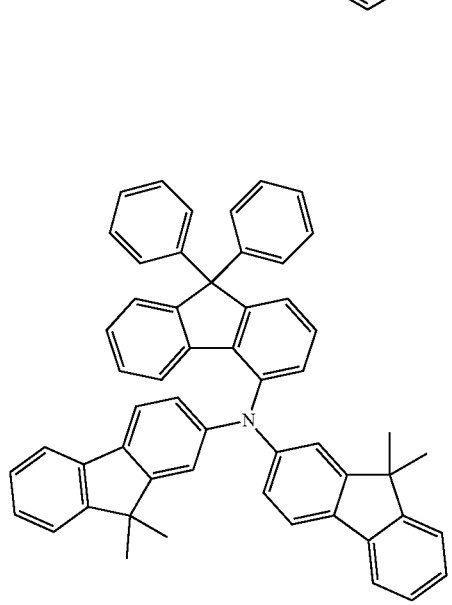
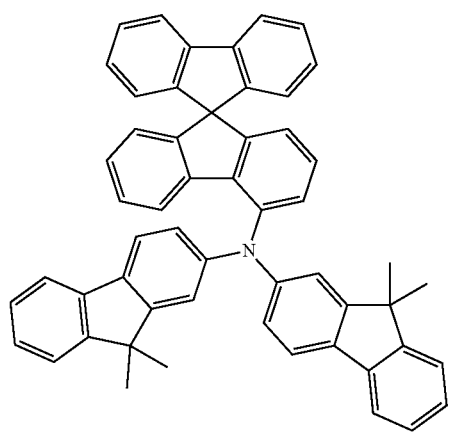

85
-continued
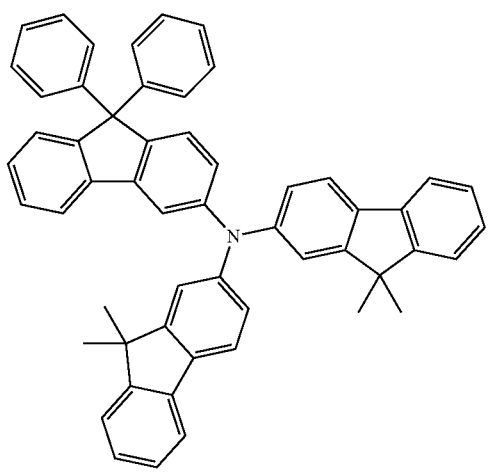
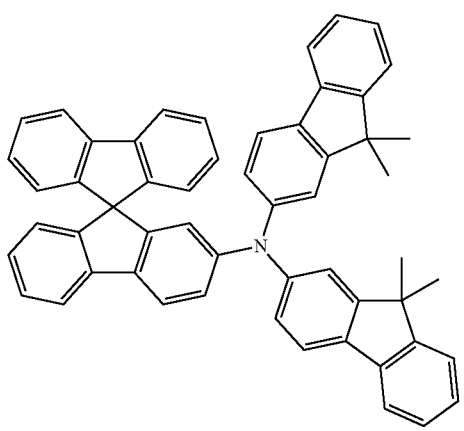
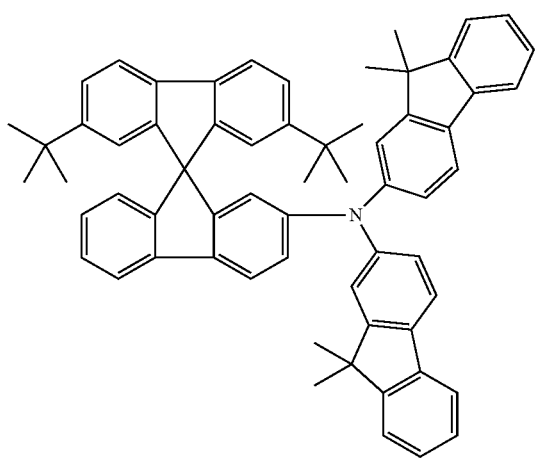
86
-continued
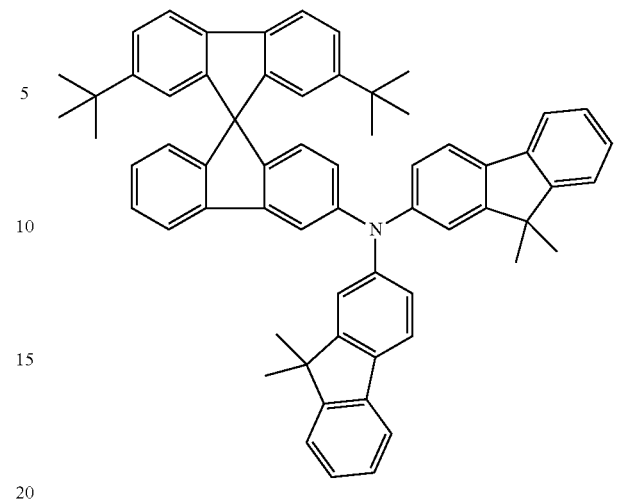
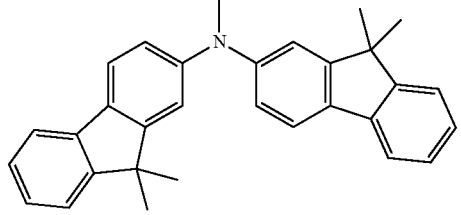
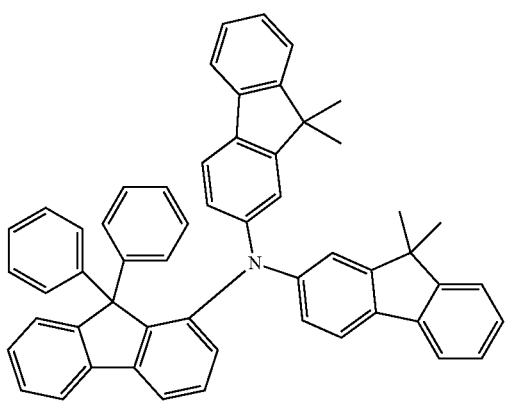

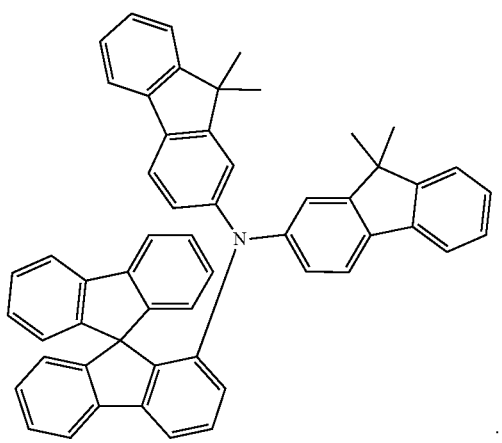
10. The organic light emitting device of claim 1, wherein Chemical Formula 2 is any one of the following compounds:
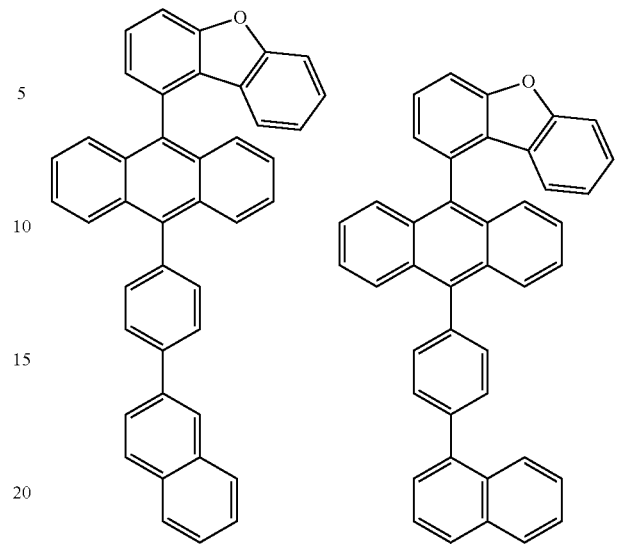
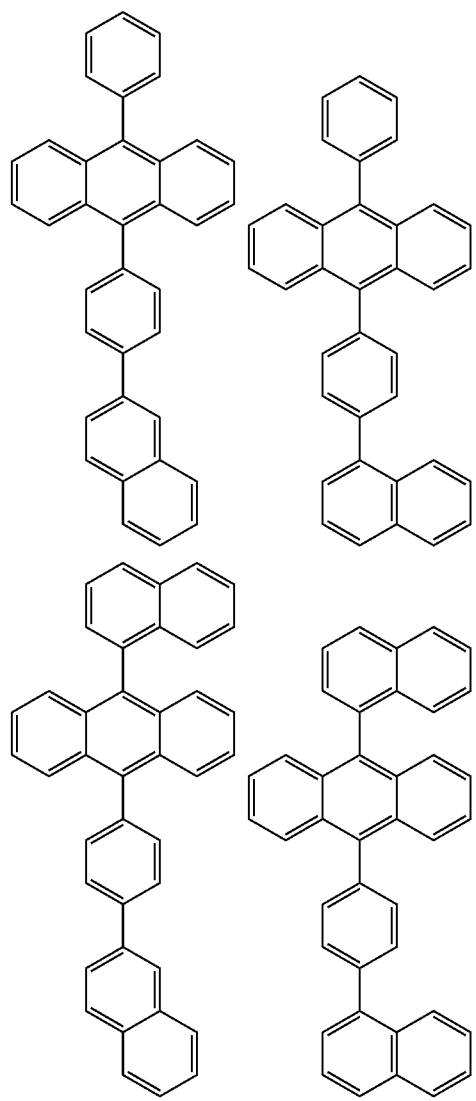
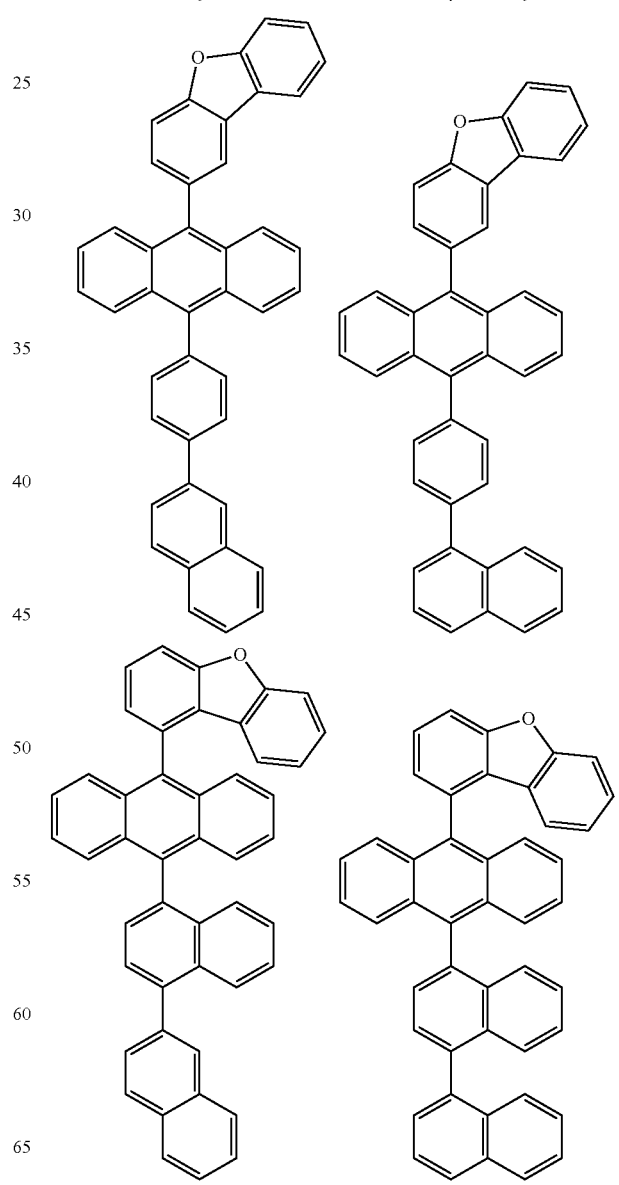

89
-continued
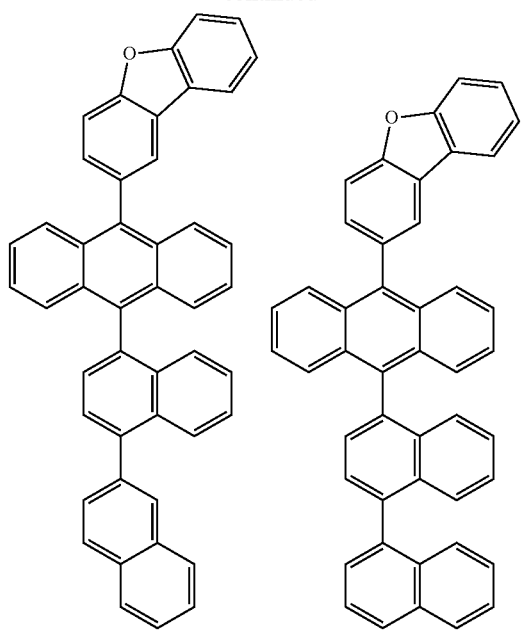
90
-continued
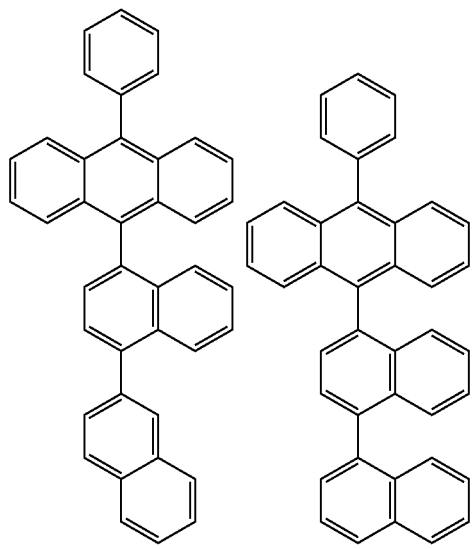
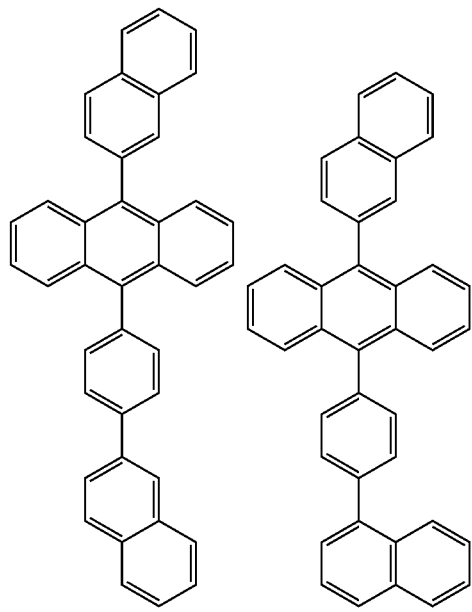
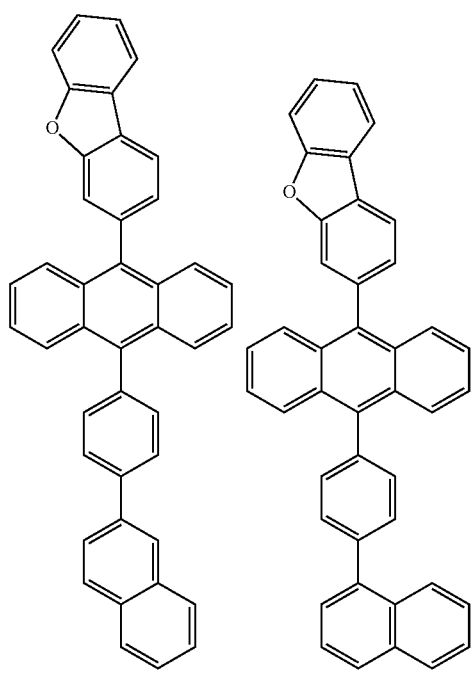

91
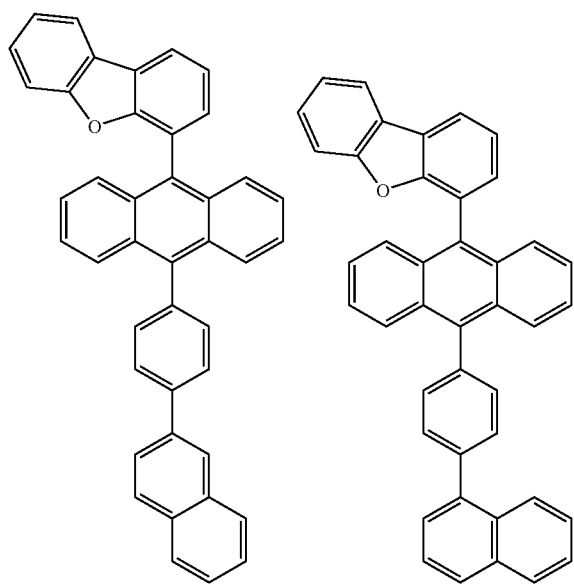
92
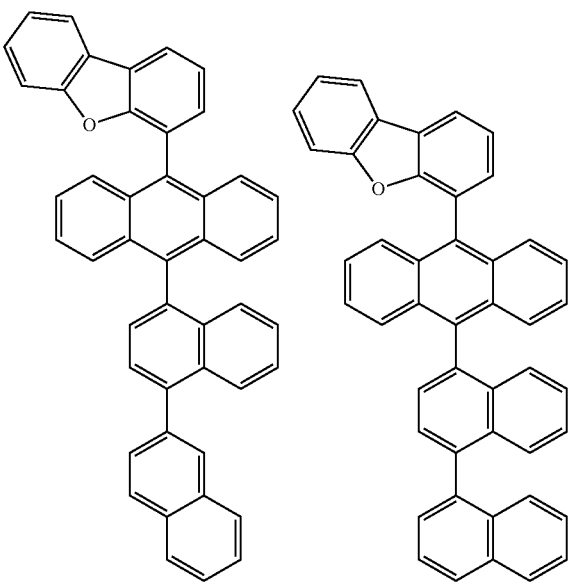
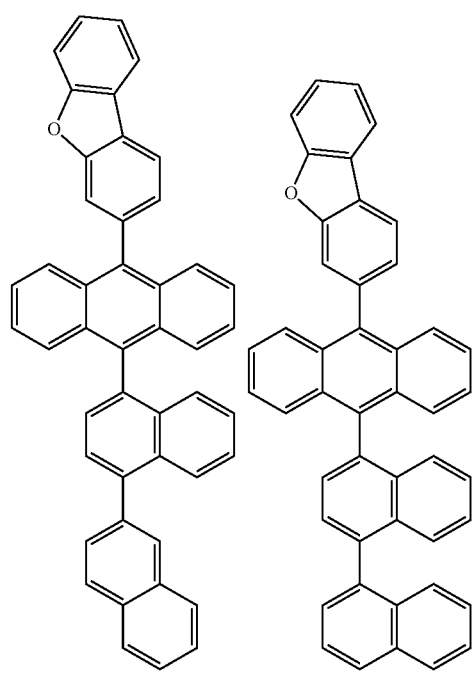
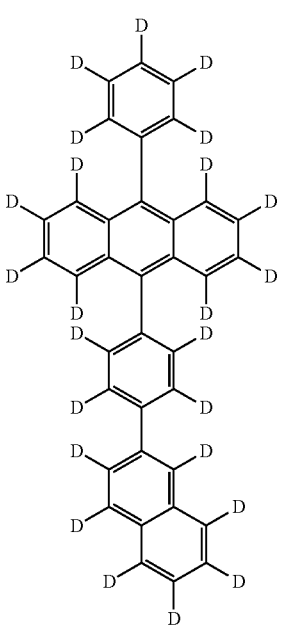

93
-continued
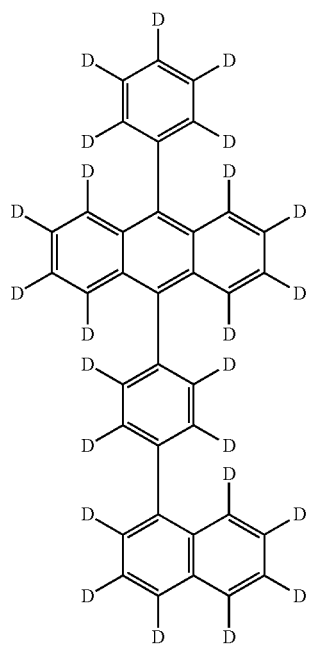
94
-continued
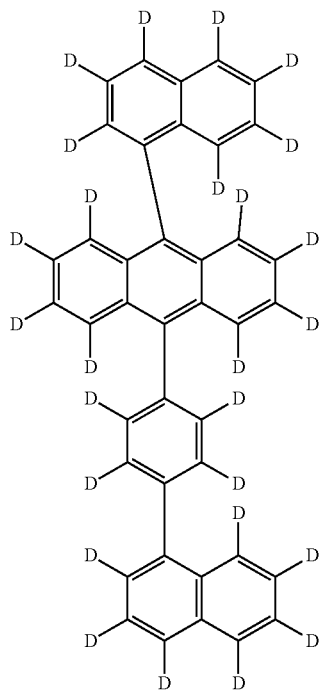
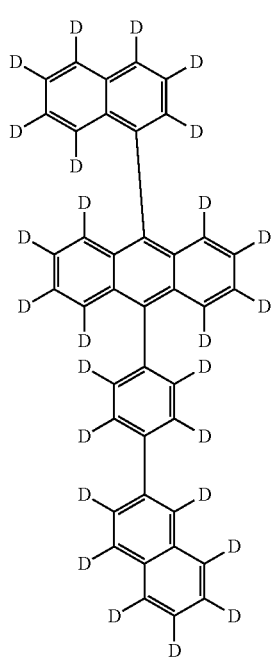

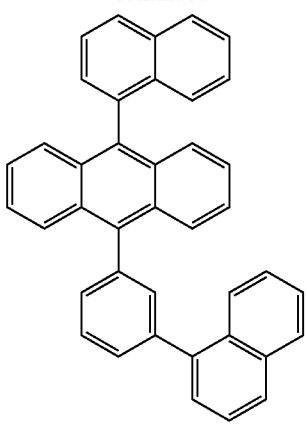
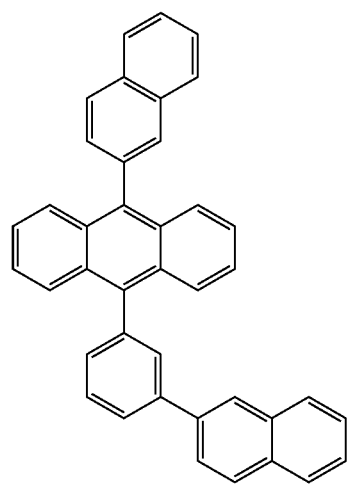
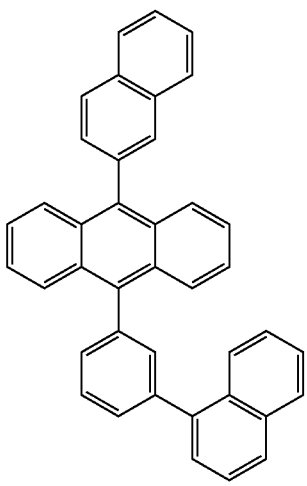
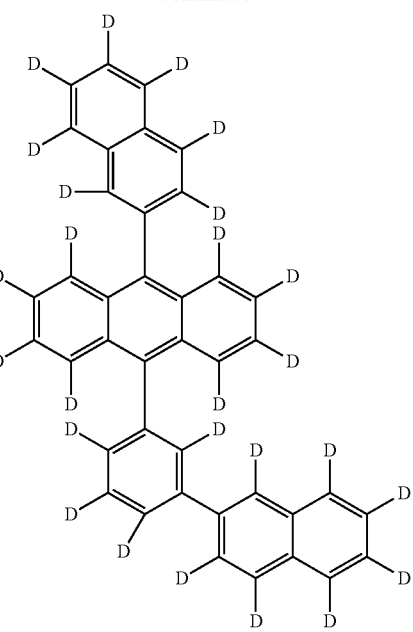
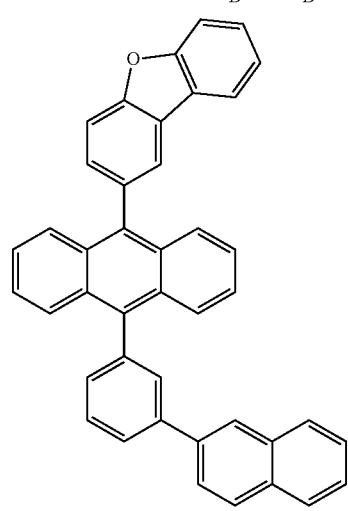
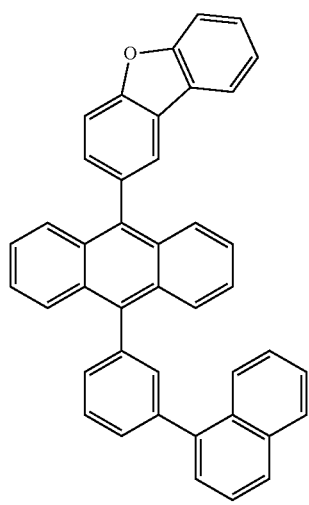

-continued
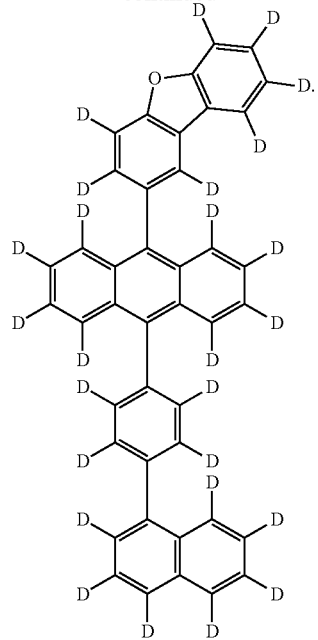

What is claimed is:

1. An organic light emitting device comprising:
a first electrode;
a second electrode provided opposite to the first electrode; and
an organic material provided between the first electrode and the second electrode,
wherein the organic material includes a hole transfer layer and an electron blocking layer, and the hole transfer layer and the electron blocking layer include a compound of the following Chemical Formula 1;
the materials of the hole transfer layer and the electron blocking layer are different from each other; and
the organic material further comprising one or more layers that are neither the hole transfer layer nor the electron blocking layer include a compound of the following Chemical Formula 2:

[Chemical Formula 1]

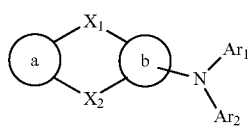

in Chemical Formula 1,
Ar$_1$ and Ar$_2$ are the same as or different from each other, and each independently a substituted or unsubstituted aryl group including one or two 6-membered rings, or a substituted or unsubstituted heteroaryl group;
a and b are the same as or different from each other, and each independently a substituted or unsubstituted aromatic ring;
X$_1$ and X$_2$ are the same as or different from each other, and each independently a direct bond or CRR'; and
when one of X$_1$ and X$_2$ is a direct bond, the other one is CRR',

[Chemical Formula 2]

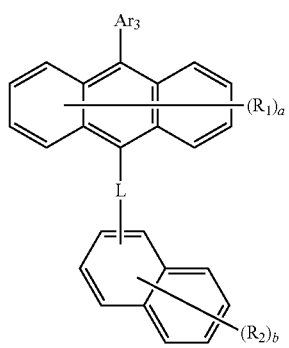

in Chemical Formula 2,
Ar3 is a substituted or unsubstituted aryl group, or a substituted or unsubstituted heteroaryl group;
L is a substituted or unsubstituted arylene group;
R, R', R$_1$ and R$_2$ are the same as or different from each other, and each independently hydrogen, deuterium, a substituted or unsubstituted alkyl group, or a substituted or unsubstituted aryl group, or bond to adjacent substituents to form a substituted or unsubstituted hydrocarbon ring;
a is an integer of 0 to 8;
b is an integer of 0 to 7;

when a is a plural number, R$_{1S}$ are the same as or different from each other; and
when b is a plural number, R$_{2S}$ are the same as or different from each other.

2. The organic light emitting device of claim 1, wherein Chemical Formula 1 is the following Chemical Formula 1-1:

[Chemical Formula 1-1]

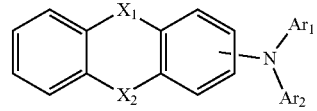

in Chemical Formula 1-1,
Ar$_1$, Ar$_2$, X$_1$ and X$_2$ have the same definitions as in Chemical Formula 1.

3. The organic light emitting device of claim 1, wherein the electron blocking layer includes a compound of the following Chemical Formula 1-2 or Chemical Formula 1-3:

[Chemical Formula 1-2]

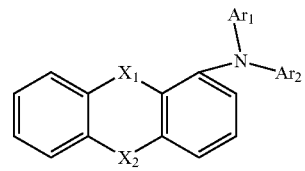

[Chemical Formula 1-3]

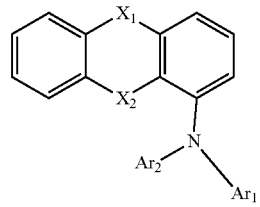

in Chemical Formula 1-2 and Chemical Formula 1-3,
Ar$_1$, Ar$_2$, X$_1$ and X$_2$ have the same definitions as in Chemical Formula 1.

4. The organic light emitting device of claim 1, wherein the hole transfer layer includes a compound of the following Chemical Formula 1-4 or Chemical Formula 1-5:

[Chemical Formula 1-4]

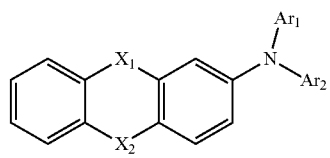

[Chemical Formula 1-5]

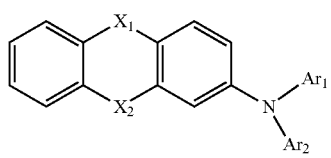

in Chemical Formula 1-4 and Chemical Formula 1-5,
Ar$_1$, Ar$_2$, X$_1$ and X$_2$ have the same definitions as in Chemical Formula 1.

5. The organic light emitting device of claim 1, wherein the one or more organic material layers including the compound of Chemical Formula 2 are light emitting layers.

6. The organic light emitting device of claim 5, wherein Chemical Formula 2 is the following Chemical Formula 2-1 or 2-2:

[Chemical Formula 2-1]

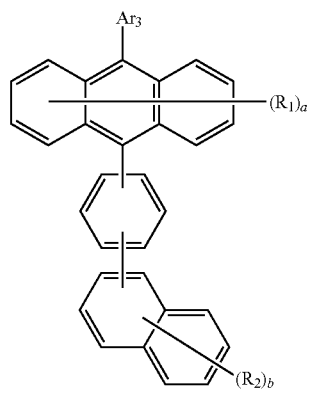

[Chemical Formula 2-2]

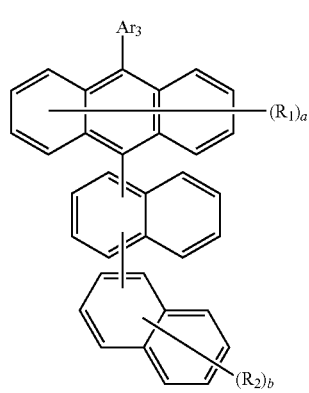

in Chemical Formulae 2-1 and 2-2, $Ar_3$, a, b, $R_1$ and $R_2$ have the same definitions as in Chemical Formula 2.

7. The organic light emitting device of claim 5, wherein Chemical Formula 2 is the following Chemical Formula 2-3 or 2-4:

[Chemical Formula 2-3]

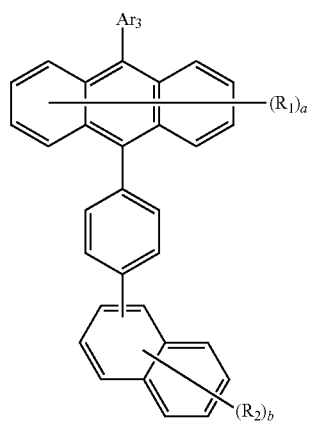

[Chemical Formula 2-4]

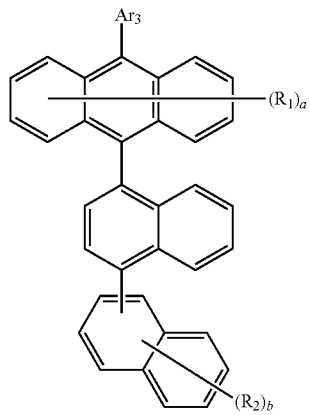

in Chemical Formulae 2-3 and 2-4, $Ar_3$, a, b, $R_1$ and $R_2$ have the same definitions as in Chemical Formula 2.

8. The organic light emitting device of claim 1, wherein the organic material includes a light emitting layer, and triplet energy of the electron blocking layer is larger than triplet energy of a host of the light emitting layer.

9. The organic light emitting device of claim 1, wherein Chemical Formula 1 is any one of the following compounds: